(12) United States Patent
Liu

(10) Patent No.: US 11,659,702 B2
(45) Date of Patent: May 23, 2023

(54) BONDED SEMICONDUCTOR DEVICES HAVING PROCESSOR AND STATIC RANDOM-ACCESS MEMORY AND METHODS FOR FORMING THE SAME

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/202,200

(22) Filed: Mar. 15, 2021

(65) Prior Publication Data

US 2021/0202495 A1 Jul. 1, 2021

Related U.S. Application Data

(60) Division of application No. 16/669,461, filed on Oct. 30, 2019, now Pat. No. 11,201,157, which is a
(Continued)

(51) Int. Cl.
*H01L 27/11* (2006.01)
*H01L 21/02* (2006.01)
(Continued)

(52) U.S. Cl.
CPC .... *H01L 27/1104* (2013.01); *H01L 21/02013* (2013.01); *H01L 21/2007* (2013.01);
(Continued)

(58) Field of Classification Search
None
See application file for complete search history.

(56) References Cited

U.S. PATENT DOCUMENTS 6,243,287 B1 * 6/2001 Naffziger ................. G11C 8/10
365/230.03
8,563,403 B1 10/2013 Farooq et al.
(Continued)

FOREIGN PATENT DOCUMENTS

CN 109155301 A 1/2019
CN 109449137 A 3/2019
(Continued)

OTHER PUBLICATIONS

International Search Report issued in corresponding International Application No. PCT/CN2019/105313, dated May 26, 2020, 4 pages.
(Continued)

*Primary Examiner* — Alexander G Ghyka
(74) *Attorney, Agent, or Firm* — Bayes PLLC

(57) ABSTRACT

Embodiments of semiconductor devices and fabrication methods thereof are disclosed. In an example, a method for forming a semiconductor device is disclosed. First semiconductor structures are formed on a first wafer. At least one of the first semiconductor structures includes a processor and a first bonding layer including first bonding contacts. Second semiconductor structures are formed on a second wafer. At least one of the second semiconductor structures includes an array of SRAM cells and a second bonding layer including second bonding contacts. The first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into dies. At least one of the dies includes the bonded first and second semiconductor structures.

20 Claims, 13 Drawing Sheets

Related U.S. Application Data continuation of application No. PCT/CN2019/105313, filed on Sep. 11, 2019.

(51) Int. Cl.
    *H01L 21/20*     (2006.01)
    *H01L 21/822*     (2006.01)
    *H01L 25/065*     (2023.01)
    *H01L 27/108*     (2006.01)

(52) U.S. Cl.
    CPC ...... *H01L 21/8221* (2013.01); *H01L 25/0657* (2013.01); *H01L 27/10894* (2013.01)

(56) References Cited

U.S. PATENT DOCUMENTS

| | | |
|---|---|---|
| 9,871,049 B1 | 1/2018 | He et al. |
| 2007/0145367 A1 | 6/2007 | Chen et al. |
| 2014/0146589 A1* | 5/2014 | Park .................. G06F 12/0893 365/51 |
| 2014/0264915 A1 | 9/2014 | Huang et al. |
| 2015/0262877 A1 | 9/2015 | Kurita et al. |
| 2017/0186732 A1 | 6/2017 | Chu et al. |
| 2017/0301650 A1* | 10/2017 | Yu ........................ H01L 21/0217 |
| 2018/0261623 A1 | 9/2018 | Higashi et al. |
| 2018/0374864 A1* | 12/2018 | Fukuzumi ......... H01L 21/76898 |
| 2019/0080748 A1* | 3/2019 | Weier ..................... G11C 29/74 |
| 2019/0267074 A1 | 8/2019 | Fishburn et al. |
| 2019/0363079 A1 | 11/2019 | Thei et al. |
| 2020/0286943 A1* | 9/2020 | Tange ............... H01L 27/14689 |

FOREIGN PATENT DOCUMENTS

| | | |
|---|---|---|
| CN | 109891582 A | 6/2019 |
| CN | 110192269 A | 8/2019 |

OTHER PUBLICATIONS

Written Opinion of the International Searching Authority issued in corresponding International Application No. PCT/CN2019/105313, dated May 26, 2020, 5 pages.

* cited by examiner

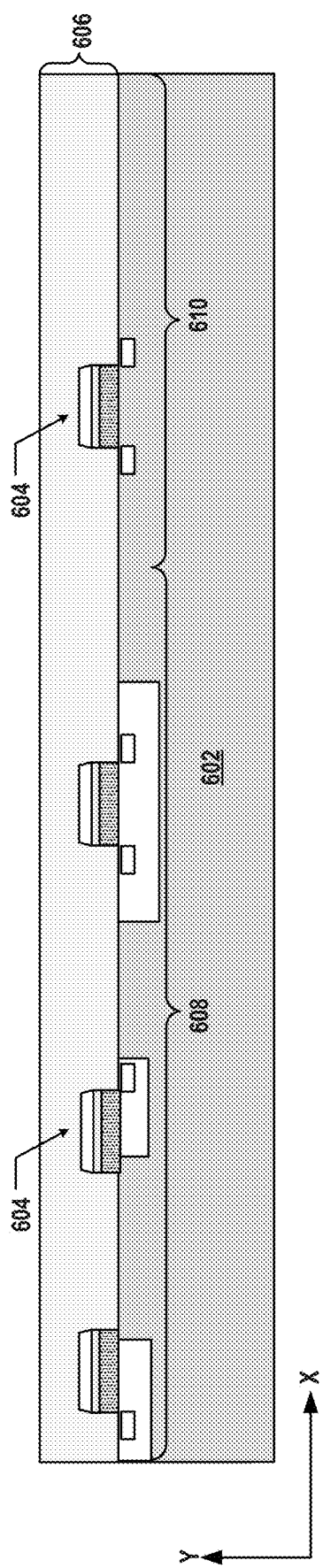
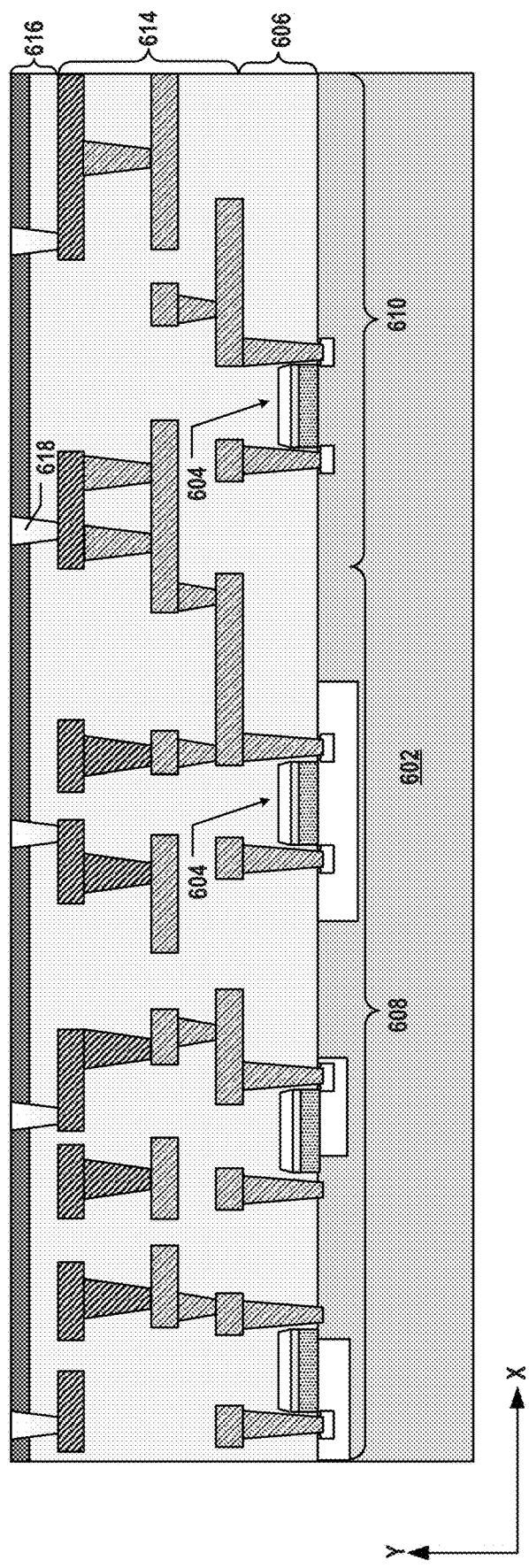
FIG. 6A
FIG. 6B

BONDED SEMICONDUCTOR DEVICES HAVING PROCESSOR AND STATIC RANDOM-ACCESS MEMORY AND METHODS FOR FORMING THE SAME

CROSS-REFERENCE TO RELATED APPLICATIONS

This application is division of U.S. application Ser. No. 16/669,461, filed on Oct. 30, 2019, entitled "BONDED SEMICONDUCTOR DEVICES HAVING PROCESSOR AND STATIC RANDOM-ACCESS MEMORY AND METHODS FOR FORMING THE SAME," which is continuation of International Application No. PCT/CN2019/105313, filed on Sep. 11, 2019, entitled "BONDED SEMICONDUCTOR DEVICES HAVING PROCESSOR AND STATIC RANDOM-ACCESS MEMORY AND METHODS FOR FORMING THE SAME," both of which are incorporated herein by reference in their entireties.

BACKGROUND

Embodiments of the present disclosure relate to semiconductor devices and fabrication methods thereof.

In modern microprocessors including central processing units (CPUs) and graphics processing units (GPUs), the cache size is playing an incrementally important role for processor performance enhancement. A cache is a smaller, faster memory, closer to a processor core (e.g., the distance in the order of millimeters to a few centimeters), which stores copies of the data from frequently-used main memory locations. Most processors have different independent caches, including instruction and data caches, where the data cache is usually organized as a hierarchy of more cache levels (e.g., L1, L2, L3, L4, etc.). A cache is usually formed of an array of dense static random-access memory (SRAM) cells.

SUMMARY

Embodiments of semiconductor devices and fabrication methods thereof are disclosed herein.

In one example, a semiconductor device includes a first semiconductor structure including a processor and a first bonding layer including a plurality of first bonding contacts. The semiconductor device also includes a second semiconductor structure including an array of SRAM cells and a second bonding layer including a plurality of second bonding contacts. The semiconductor device further includes a bonding interface between the first bonding layer and the second bonding layer. The first bonding contacts are in contact with the second bonding contacts at the bonding interface.

In another example, a method for forming a semiconductor device is disclosed. A plurality of first semiconductor structures are formed on a first wafer. At least one of the first semiconductor structures includes a processor and a first bonding layer including a plurality of first bonding contacts. A plurality of second semiconductor structures are formed on a second wafer. At least one of the second semiconductor structures includes an array of SRAM cells and a second bonding layer including a plurality of second bonding contacts. The first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In still another example, a method for forming a semiconductor device is disclosed. A plurality of first semiconductor structures are formed on a first wafer. At least one of the first semiconductor structures includes a processor and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of SRAM cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

BRIEF DESCRIPTION OF THE DRAWINGS

The accompanying drawings, which are incorporated herein and form a part of the specification, illustrate embodiments of the present disclosure, and together with the description, further serve to explain the principles of the present disclosure and to enable a person skilled in the pertinent art to make and use the present disclosure.

FIGS. 6A and 6B illustrate a fabrication process for forming an exemplary semiconductor structure having a processor and other logic circuits, according to some embodiments.

Figure 1A:
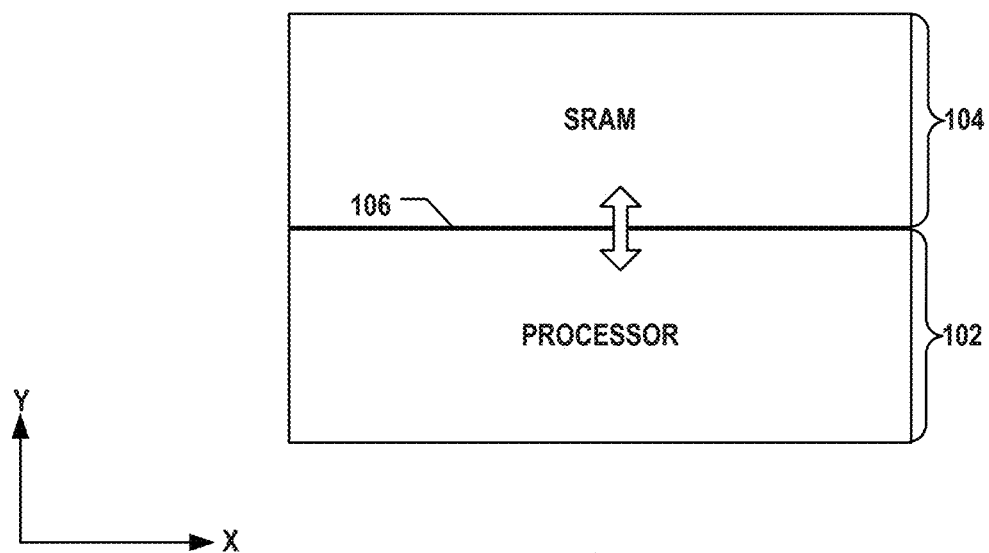
FIG. 1A illustrates a schematic view of a cross-section of an exemplary semiconductor device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to affect such features, structures and/or characteristics in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a "wafer" is a piece of a semiconductor material for semiconductor devices to build in and/or on it and that can undergo various fabrication processes before being separated into dies.

As modern processor (also known as "microprocessor") developed into more advanced generations, the cache size is playing an incrementally important role for processor performance enhancement. In some cases, cache, which is usually formed of dense high-speed SRAM cells, can occupy half or even more chip real estate in microprocessor chip. Also, the resistive-capacitive (RC) delay from the cache to the processor core could become significant to degrade performance. Thus, both interconnect RC delay and the SRAM yield dominate microprocessor performance and yield. However, because the chip size of microprocessor is getting bigger and bigger in the order of a few centimeters, the RC delay from SRAM cache to the processor core become significant to degrade performance.

Various embodiments in accordance with the present disclosure provide a semiconductor device with a processor and SRAM cache integrated on a bonded chip to achieve better cache performance (faster data transfer with higher efficiency), wider data bandwidth, and faster memory interface speed. The semiconductor device disclosed herein can include a first semiconductor structure having a processor (e.g., having multiple processor cores) and a second semiconductor structure having SRAM (e.g., as cache) bonded to the first semiconductor structure with a large number of short-distance vertical metal interconnects instead of the peripherally-distributed, long-distance metal routing, or even conventional through silicon vias (TSVs). With the SRAM being directly above or below the processor cores, interconnect distance between the processor cores and SRAM is shortened, e.g., from the centimeter-level to micrometer-level, thereby significantly reducing RC delay and chip/circuit board size, as well as increasing data transfer speed. Moreover, shorter manufacturing cycle time with higher yield can be achieved due to less interactive influences from manufacturing processes of the processor wafer and the SRAM wafer as well as the known good hybrid bonding yield.

FIG. 1A illustrates a schematic view of a cross-section of an exemplary semiconductor device 100, according to some embodiments. Semiconductor device 100 represents an example of a bonded chip. The components of semiconductor device 100 (e.g., processors and SRAM) can be formed separately on different substrates and then jointed to form a bonded chip. Semiconductor device 100 can include a first semiconductor structure 102 including a processor. In some embodiments, the processor in first semiconductor structure 102 uses complementary metal-oxide-semiconductor (CMOS) technology. The processor can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed.

The processor can be a specialized processor including, but not limited to, CPU, GPU, digital signal processor (DSP), tensor processing unit (TPU), vision processing unit (VPU), neural processing unit (NPU), synergistic processing unit (SPU), physics processing unit (PPU), and image signal processor (ISP). The processor can also be a system-on-chip (SoC) that combines multiple specialized processors, such as an application processor, baseband processor, and so on. In some embodiments in which semiconductor device 100 is used in mobile devices (e.g., smartphones, tablets, eyeglasses, wrist watches, virtual reality/augmented reality headsets, laptop computers, etc.), an application processor handles applications running in an operating system environment, and a baseband processor handles the cellular communications, such as the second-generation (2G), the third-generation (3G), the fourth-generation (4G), the fifth-generation (5G), the sixth-generation (6G) cellular communications, and so on.

A processor can include one or more processing units (also known as "processor cores" or "cores"), each of which reads and executes instructions, and one or more caches formed of high-speed memory, such as SRAM. In some embodiments, the processor in first semiconductor structure 102 does not include an SRAM cell. In other words, a cache is not included in the processor in first semiconductor structure 102, according to some embodiments. For example, the processor in first semiconductor structure 102 may consist of (i.e., include only) one or more processor cores.

Other processing units (also known as "logic circuits") besides the processor can be formed in first semiconductor structure 102 as well, such as one or more controllers, one or more interface circuits, and the entirety or part of the peripheral circuits of the SRAM in a second semiconductor structure 104. A controller can handle a specific operation in an embedded system. In some embodiments in which semiconductor device 100 is used in mobile devices, each controller can handle a specific operation of the mobile device, for example, communications other than cellular communication (e.g., Bluetooth communication, Wi-Fi communication, FM radio, etc.), power management, display drive, positioning and navigation, touch screen, camera, etc. First semiconductor structure 102 of semiconductor device 100 thus can further include a Bluetooth controller, a Wi-Fi controller, a FM radio controller, a power controller, a display controller, a GPS controller, a touch screen controller, a camera controller, to name a few, each of which is configured to control operations of the corresponding component in a mobile device.

In some embodiments, first semiconductor structure 102 of semiconductor device also includes one or more interface circuits configured to transmit and receive a variety type of signals, such as data signals, control signals, state/status signals, command signals, etc., to and from semiconductor device 100. The interface circuits can include one or more bus circuits (e.g., bus interface units) and one or more input/output (I/O) circuits. In some embodiments, first semiconductor structure 102 of semiconductor device 100 further includes the entirety or part the peripheral circuits of the SRAM of second semiconductor structure 104. The peripheral circuits (also known as control and sensing circuits) can include any suitable digital, analog, and/or mixed-signal circuits used for facilitating the operations of the SRAM. For example, the peripheral circuits can include one or more of an I/O buffer, a decoder (e.g., a row decoder and a column decoder), a sense amplifier, or any active or passive components of the circuit (e.g., transistors, diodes, resistors, or capacitors).

Semiconductor device 100 can also include second semiconductor structure 104 including an array of SRAM cells. That is, second semiconductor structure 104 can be an SRAM memory device. The SRAM and the logic circuits (e.g., the processor and peripheral circuits) are formed on different substrates and then integrated vertically in semiconductor device 100, allowing shorter interconnects, less RC delay, and higher data transfer speed. The memory controller of the SRAM can be embedded as part of the peripheral circuits in first semiconductor structure 102 and/or second semiconductor structure 104. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM can enable high-speed operations of semiconductor device 100, used as one or more caches (e.g., instruction cache or data cache) and/or data buffers.

As shown in FIG. 1A, semiconductor device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the SRAM in second semiconductor structure 104 and the processor in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
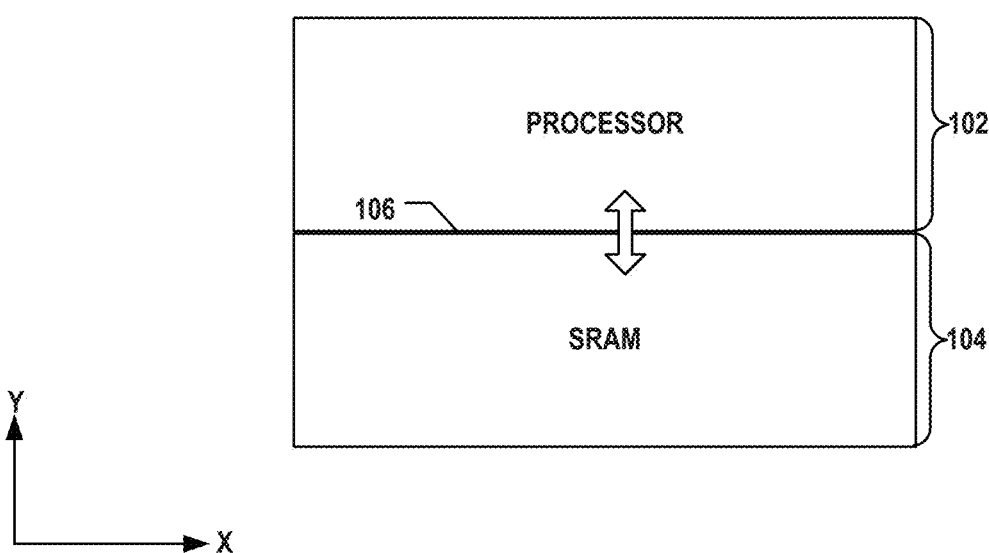
FIG. 1B illustrates a schematic view of a cross-section of another exemplary semiconductor device, according to some embodiments.

It is understood that the relative positions of stacked first and second semiconductor structures 102 and 104 are not limited. FIG. 1B illustrates a schematic view of a cross-section of another exemplary semiconductor device 101, according to some embodiments. Different from semiconductor device 100 in FIG. 1A in which second semiconductor structure 104 including the array of SRAM cells is above first semiconductor structure 102 including the processor, in semiconductor device 101 in FIG. 1B, first semiconductor structure 102 including the processor is above second semiconductor structure 104 including the array of SRAM cells. Nevertheless, bonding interface 106 is formed vertically between first and second semiconductor structures 102 and 104 in semiconductor device 101, and first and second semiconductor structures 102 and 104 are jointed vertically through bonding (e.g., hybrid bonding), according to some embodiments. Data transfer between the SRAM in second semiconductor structure 104 and the processor in first semiconductor structure 102 can be performed through the interconnects (e.g., bonding contacts) across bonding interface 106.

In some embodiments, first semiconductor structure 102 does not include a SRAM cell, and second semiconductor structure 104 does not include a processor. That is, first semiconductor structure 102 can be a dedicated logic structure without any memory device (e.g., SRAM), and second semiconductor structure can be a dedicated memory structure without any logic device (e.g., processor core).

Figure 2A:
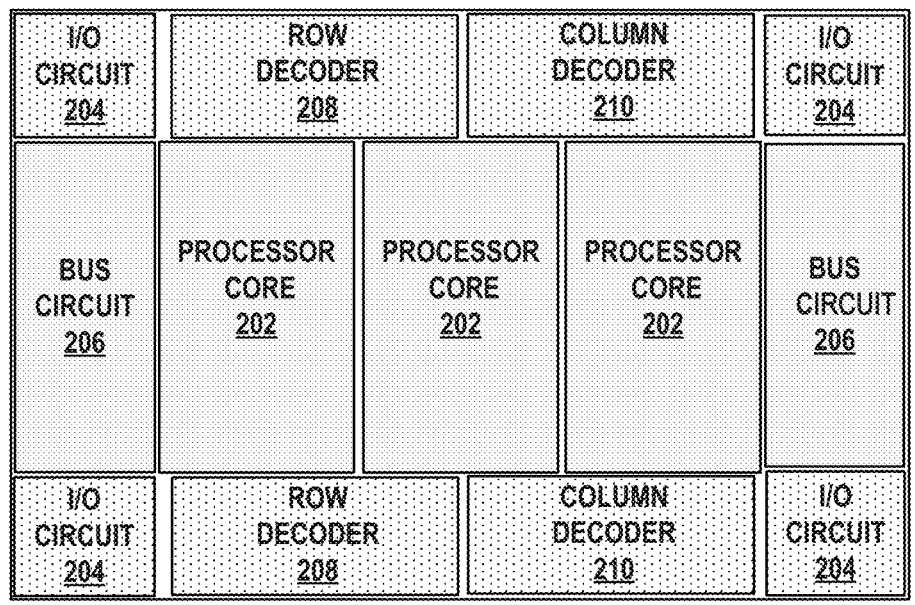
FIG. 2A illustrates a schematic plan view of an exemplary semiconductor structure having a processor, peripheral circuits, and interface circuits, according to some embodiments.

FIG. 2A illustrates a schematic plan view of an exemplary semiconductor structure 200 having a processor, peripheral circuits, and interface circuits, according to some embodiments. Semiconductor structure 200 may be one example of first semiconductor structure 102. Semiconductor structure 200 can include a processor having a plurality of processor cores 202 on the same substrate as other logic circuits and fabricated using the same logic process as other logic circuits. Each processor core 202 can be a CPU core, a GPU core, a DSP core, an application processor core, a baseband processor core, to name a few. Other logic circuits can include interface circuits, such as I/O circuits 204 and bus circuits 206. Other logic circuits can also include all the peripheral circuits for controlling and sensing SRAM 212, including, for example, row decoders 208, column decoders 210, and any other suitable devices. FIG. 2A shows an exemplary layout in which processor cores 202, the interface circuits (e.g., bus circuits 206 and I/O circuits 204), and the peripheral circuits (e.g., row decoders 208 and column decoders 210) are formed in different regions on the same plane. For example, the interface circuits (e.g., bus circuits 206 and I/O circuits 204) and the peripheral circuits (e.g., row decoders 208 and column decoders 210) may be formed outside of processor cores 202.

Figure 2B:
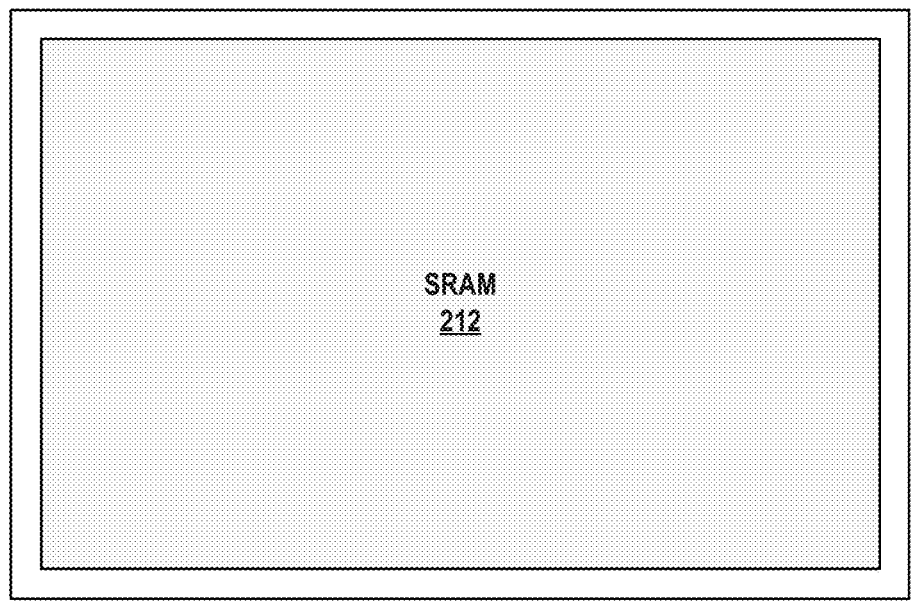
FIG. 2B illustrates a schematic plan view of an exemplary semiconductor structure having SRAM, according to some embodiments.

FIG. 2B illustrates a schematic plan view of an exemplary semiconductor structure 201 having SRAM 212, according to some embodiments. Semiconductor structure 201 may be one example of second semiconductor structure 104. By moving all the peripheral circuits (e.g., row decoders 208 and column decoders 210) away from semiconductor structure 201 (e.g., to semiconductor structure 200), the size of SRAM 212 (e.g., the number of SRAM cells) in semiconductor structure 201 can be increased It is understood that the layouts of semiconductor structures 200 and 201 are not limited to the exemplary layouts in FIGS. 2A and 2B. In some embodiments, at least some of processor cores 202, the interface circuits (e.g., bus circuits 206 and I/O circuits 204), and the peripheral circuits (e.g., row decoders 208 and column decoders 210) are stacked one over another, i.e., in different planes. For example, the interface circuits (e.g., bus circuits 206 and I/O circuits 204) and the peripheral circuits (e.g., row decoders 208 and column decoders 210) may be formed above or below processor cores 202 to further reduce the chip size.

Figure 3A:
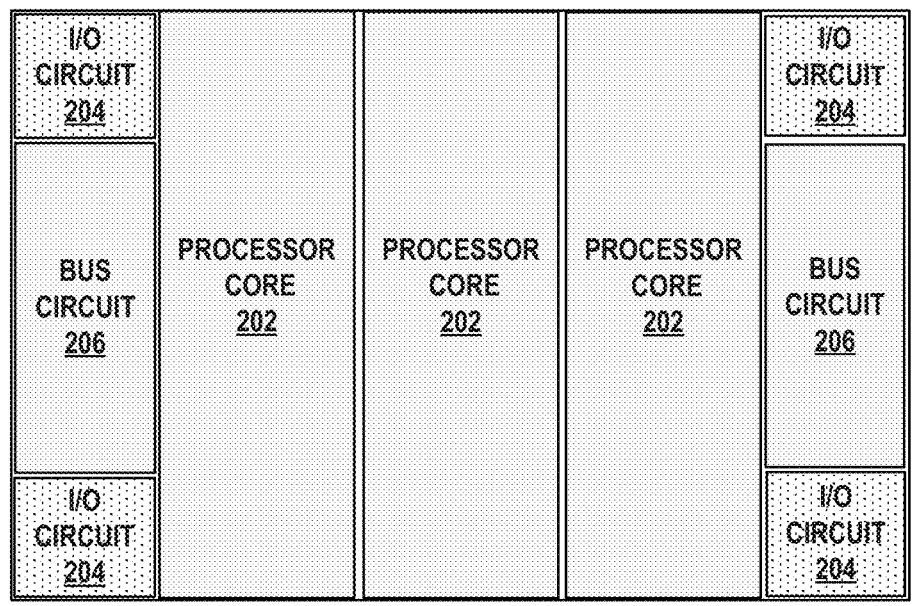
FIG. 3A illustrates a schematic plan view of an exemplary semiconductor structure having a processor and interface circuits, according to some embodiments.
Figure 3B:
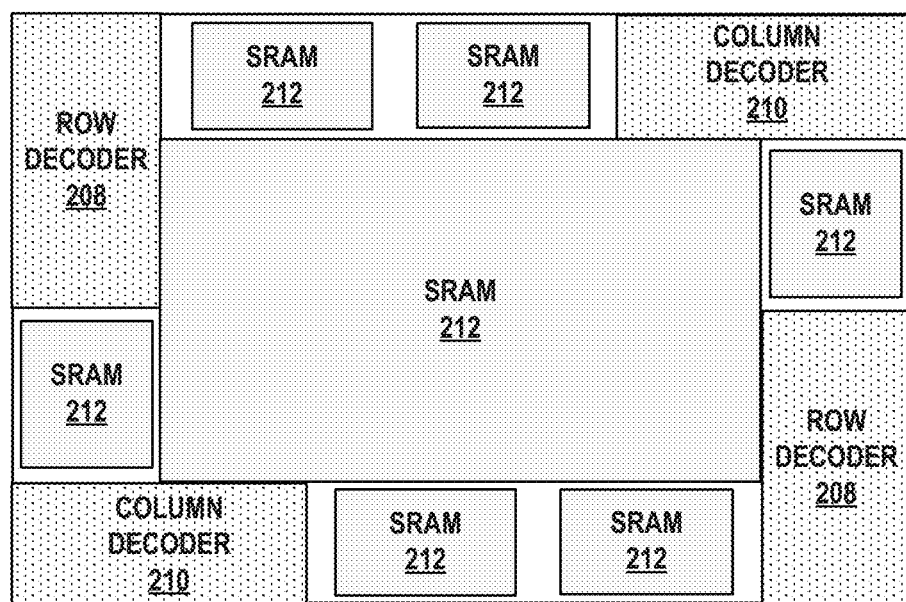
FIG. 3B illustrates a schematic plan view of an exemplary semiconductor structure having SRAM and peripheral circuits, according to some embodiments.

It is further understood that part or the entirety of the peripheral circuits of SRAM 212 (e.g., row decoders 208, column decoders 210, and any other suitable devices) may be formed in the same semiconductor structure in which SRAM 212 is formed. The peripheral circuits of SRAM 212 may be distributed in both semiconductor structures 200 and 201, according to some other embodiments. In some embodiments, the peripheral circuits of SRAM 212 may be formed only in the same semiconductor structure in which SRAM 212 is formed. For example, FIG. 3A illustrates a schematic plan view of an exemplary semiconductor structure 300 having a processor and interface circuits, according to some embodiments; FIG. 3B illustrates a schematic plan view of an exemplary semiconductor structure 301 having SRAM and peripheral circuits, according to some embodiments. Different from semiconductor structures 200 and 201 in FIGS. 2A and 2B, semiconductor structure 300 includes processor cores 202 and the interface circuits (e.g., bus circuits 206 and I/O circuits 204) but does not include any peripheral circuits of SRAM 212. Instead, semiconductor structure 301 includes both SRAM 212 and all the peripheral circuits of SRAM 212 (e.g., row decoders 208, column decoders 210, and any other suitable devices). As shown in FIG. 3B, in some embodiments, SRAM 212 is distributed in a plurality of separate regions in semiconductor structure 301. That is, the cache module formed by SRAM 212 can be divided into smaller cache regions, distributing in semiconductor structure 301. In one example, the distribution of the cache regions may be based on the design of the bonding contacts and/or the peripheral circuits of SRAM 212, e.g., occupying the areas without the bonding contacts and/or the peripheral circuits. In another example, the distribution of the cache regions may be random. As a result, a wider design window for SRAM 212 can be arranged achieved.

Figure 4:
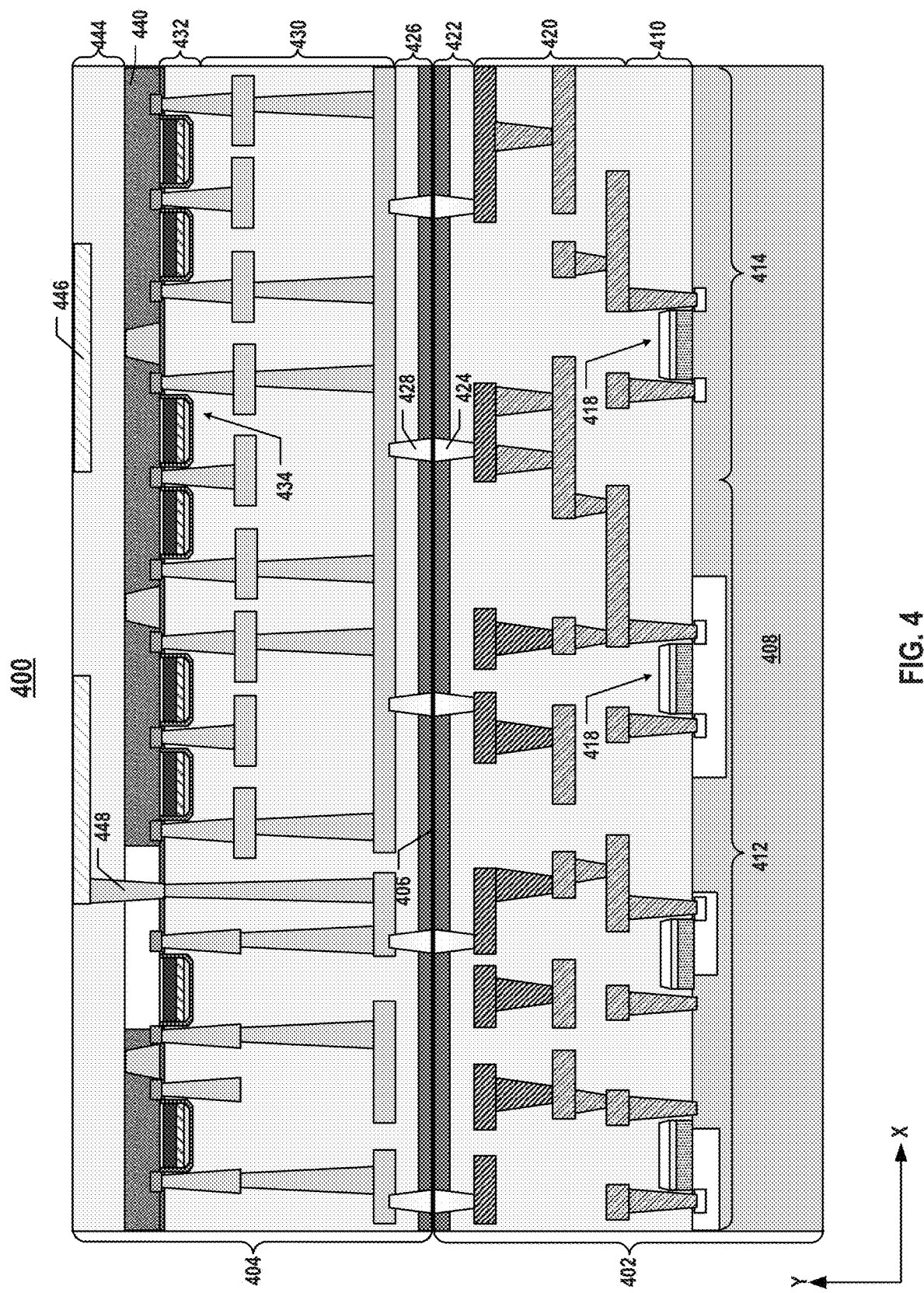
FIG. 4 illustrates a cross-section of an exemplary semiconductor device, according to some embodiments.

FIG. 4 illustrates a cross-section of an exemplary semiconductor device 400, according to some embodiments. As one example of semiconductor device 100 described above with respect to FIG. 1A, semiconductor device 400 is a bonded chip including a first semiconductor structure 402 and a second semiconductor structure 404 stacked over first semiconductor structure 402. First and second semiconductor structures 402 and 404 are jointed at a bonding interface 406 therebetween, according to some embodiments. As shown in FIG. 4, first semiconductor structure 402 can include a substrate 408, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 402 of semiconductor device 400 can include a device layer 410 above substrate

408. It is noted that x- and y-axes are added in FIG. 4 to further illustrate the spatial relationship of the components in semiconductor device 400. Substrate 408 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 400) is determined relative to the substrate of the semiconductor device (e.g., substrate 408) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 410 includes a processor 412 on substrate 408 and other logic circuits 414 on substrate 408 and outside of processor 412. In some embodiments, other logic circuits 414 include interface circuits for transmitting and receiving signals to and from semiconductor device 400 as described above in detail. In some embodiments, other logic circuits 414 include part or the entirety of the peripheral circuits for controlling and sensing the SRAM of semiconductor device 400 as described above in detail. In some embodiments, processor 412 includes a plurality of transistors 418 forming any suitable specialized processor cores and/or SoC cores as described above in detail. In some embodiments, transistors 418 further form other logic circuits 414, for example, any suitable I/O circuits or bus circuits for transmitting and receiving signals to and from semiconductor device 400, and/or any suitable digital, analog, and/or mixed-signal control and sensing circuits used for facilitating the operation of the SRAM including, but not limited to, an input/output buffer, a decoder (e.g., a row decoder and a column decoder), and a sense amplifier.

Transistors 418 can be formed "on" substrate 408, in which the entirety or part of transistors 418 are formed in substrate 408 (e.g., below the top surface of substrate 408) and/or directly on substrate 408. Isolation regions (e.g., shallow trench isolations (STIs)) and doped regions (e.g., source regions and drain regions of transistors 418) can be formed in substrate 408 as well. Transistors 418 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, first semiconductor structure 402 of semiconductor device 400 further includes an interconnect layer 420 above device layer 410 to transfer electrical signals to and from processor 412 (and other logic circuits 414 if any). Interconnect layer 420 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 420 can further include one or more interlayer dielectric (ILD) layers (also known as "intermetal dielectric (IMD) layers") in which the interconnect lines and via contacts can form. That is, interconnect layer 420 can include interconnect lines and via contacts in multiple ILD layers. The interconnect lines and via contacts in interconnect layer 420 can include conductive materials including, but not limited to, tungsten (W), cobalt (Co), copper (Cu), aluminum (Al), silicides, or any combination thereof. The ILD layers in interconnect layer 420 can include dielectric materials including, but not limited to, silicon oxide, silicon nitride, silicon oxynitride, low dielectric constant (low-k) dielectrics, or any combination thereof. In some embodiments, the devices in device layer 410 are electrically connected to one another through the interconnects in interconnect layer 420. For example, other logic circuits 414 may be electrically connected to processor 412 through interconnect layer 420.

As shown in FIG. 4, first semiconductor structure 402 of semiconductor device 400 can further include a bonding layer 422 at bonding interface 406 and above interconnect layer 420 and device layer 410 (including processor 412). Bonding layer 422 can include a plurality of bonding contacts 424 and dielectrics electrically isolating bonding contacts 424. Bonding contacts 424 can include conductive materials including, but not limited to, W, Co, Cu, Al, silicides, or any combination thereof. The remaining area of bonding layer 422 can be formed with dielectrics including, but not limited to, silicon oxide, silicon nitride, silicon oxynitride, low-k dielectrics, or any combination thereof. Bonding contacts 424 and surrounding dielectrics in bonding layer 422 can be used for hybrid bonding.

Similarly, as shown in FIG. 4, second semiconductor structure 404 of semiconductor device 400 can also include a bonding layer 426 at bonding interface 406 and above bonding layer 422 of first semiconductor structure 402. Bonding layer 426 can include a plurality of bonding contacts 428 and dielectrics electrically isolating bonding contacts 428. Bonding contacts 428 can include conductive materials including, but not limited to, W, Co, Cu, Al, silicides, or any combination thereof. The remaining area of bonding layer 426 can be formed with dielectrics including, but not limited to, silicon oxide, silicon nitride, silicon oxynitride, low-k dielectrics, or any combination thereof. Bonding contacts 428 and surrounding dielectrics in bonding layer 426 can be used for hybrid bonding. Bonding contacts 428 are in contact with bonding contacts 424 at bonding interface 406, according to some embodiments.

As described above, second semiconductor structure 404 can be bonded on top of first semiconductor structure 402 in a face-to-face manner at bonding interface 406. In some embodiments, bonding interface 406 is disposed between bonding layers 422 and 426 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 406 is the place at which bonding layers 422 and 426 are met and bonded. In practice, bonding interface 406 can be a layer with a certain thickness that includes the top surface of bonding layer 422 of first semiconductor structure 402 and the bottom surface of bonding layer 426 of second semiconductor structure 404.

In some embodiments, second semiconductor structure 404 of semiconductor device 400 further includes an interconnect layer 430 above bonding layer 426 to transfer electrical signals. Interconnect layer 430 can include a plurality of interconnects, such as MEOL interconnects and BEOL interconnects. In some embodiments, interconnects in interconnect layer 430 also include local interconnects, such as bit line contacts and word line contacts. Interconnect layer 430 can further include one or more ILD layers in which the interconnect lines and via contacts can form. The interconnect lines and via contacts in interconnect layer 430 can include conductive materials including, but not limited to, W, Co, Cu, Al, silicides, or any combination thereof. The ILD layers in interconnect layer 430 can include dielectric materials including, but not limited to, silicon oxide, silicon nitride, silicon oxynitride, low-k dielectrics, or any combination thereof.

Second semiconductor structure 404 of semiconductor device 400 can further include an array of SRAM cells 432 above interconnect layer 430 and bonding layer 426. Array of SRAM cells 432 can be used as, for example, cache and/or data buffer of semiconductor device 400. For example, array of SRAM cells 432 may function as the internal instruction cache and/or data cache of processor 412. In some embodiments, each SRAM cell 432 includes a plurality of transistors 434. In some embodiments, SRAM cell 432 is a 6T cell that consists of four transistors 434 for storing one bit of data and two transistors 434 for controlling access to the data. It is understood that SRAM cell 432 may be of any suitable configuration, such as more or fewer than six transistors (e.g., more or fewer transistors per bit). In some embodiments, transistors 434 are formed "on" a semiconductor layer 440, in which the entirety or part of transistors 434 are formed in semiconductor layer 440 and/or directly on semiconductor layer 440. Isolation regions (e.g., shallow trench isolations (STIs)) and doped regions (e.g., source regions and drain regions of transistors 434) can be formed in semiconductor layer 440 as well. In some embodiments, two access transistors 434 (e.g., transistors 434 that control access of data) are controlled by a word line, and four storage transistors 434 (e.g., transistors 434 that store the bit of data) are coupled to bit lines and controlled by two access transistors 434.

In some embodiments, second semiconductor structure 404 further includes semiconductor layer 440 disposed above and in contact with array of SRAM cells 432. Semiconductor layer 440 can be a thinned substrate on which transistors 434 are formed. In some embodiments, semiconductor layer 440 includes single-crystal silicon. In some embodiments, semiconductor layer 440 can include polysilicon, amorphous silicon, SiGe, GaAs, Ge, or any other suitable materials. Semiconductor layer 440 can also include isolation regions and doped regions (e.g., as the sources and drains of transistors 434).

As shown in FIG. 4, second semiconductor structure 404 of semiconductor device 400 can further include a pad-out interconnect layer 444 above semiconductor layer 440. Pad-out interconnect layer 444 can include interconnects, e.g., contact pads 446, in one or more ILD layers. Pad-out interconnect layer 444 and interconnect layer 430 can be formed at opposite sides of semiconductor layer 440. In some embodiments, interconnects in pad-out interconnect layer 444 can transfer electrical signals between semiconductor device 400 and outside circuits, e.g., for pad-out purposes. In some embodiments, second semiconductor structure 404 further includes one or more contacts 448 extending through semiconductor layer 440 to electrically connect pad-out interconnect layer 444 and interconnect layers 430 and 420. As a result, processor 412 and array of SRAM cells 432 (and other logic circuits 414 if any) can be electrically connected to outside circuits through contacts 448 and pad-out interconnect layer 444.

Moreover, processor 412 (and other logic circuits 414 if any) can be electrically connected to array of SRAM cells 432 through interconnect layers 430 and 420 as well as bonding contacts 428 and 424. By vertically integrating processor 412 and array of SRAM cells 432, the interconnect distance can be significantly reduced compared with laterally arranging processor 412 and array of SRAM cells 432 in the same plane of a microprocessor chip, which has a chip size in the centimeter-level. The vertical distance between processor 412 and array of SRAM cells 432 is less than 1 mm, according to some embodiments. In one example, the vertical distance between processor 412 and array of SRAM cells 432 is between 1 μm and 1 mm (e.g., 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, any range bounded by the lower end by any of these values, or in any range defined by any two of these values).

Figure 5:
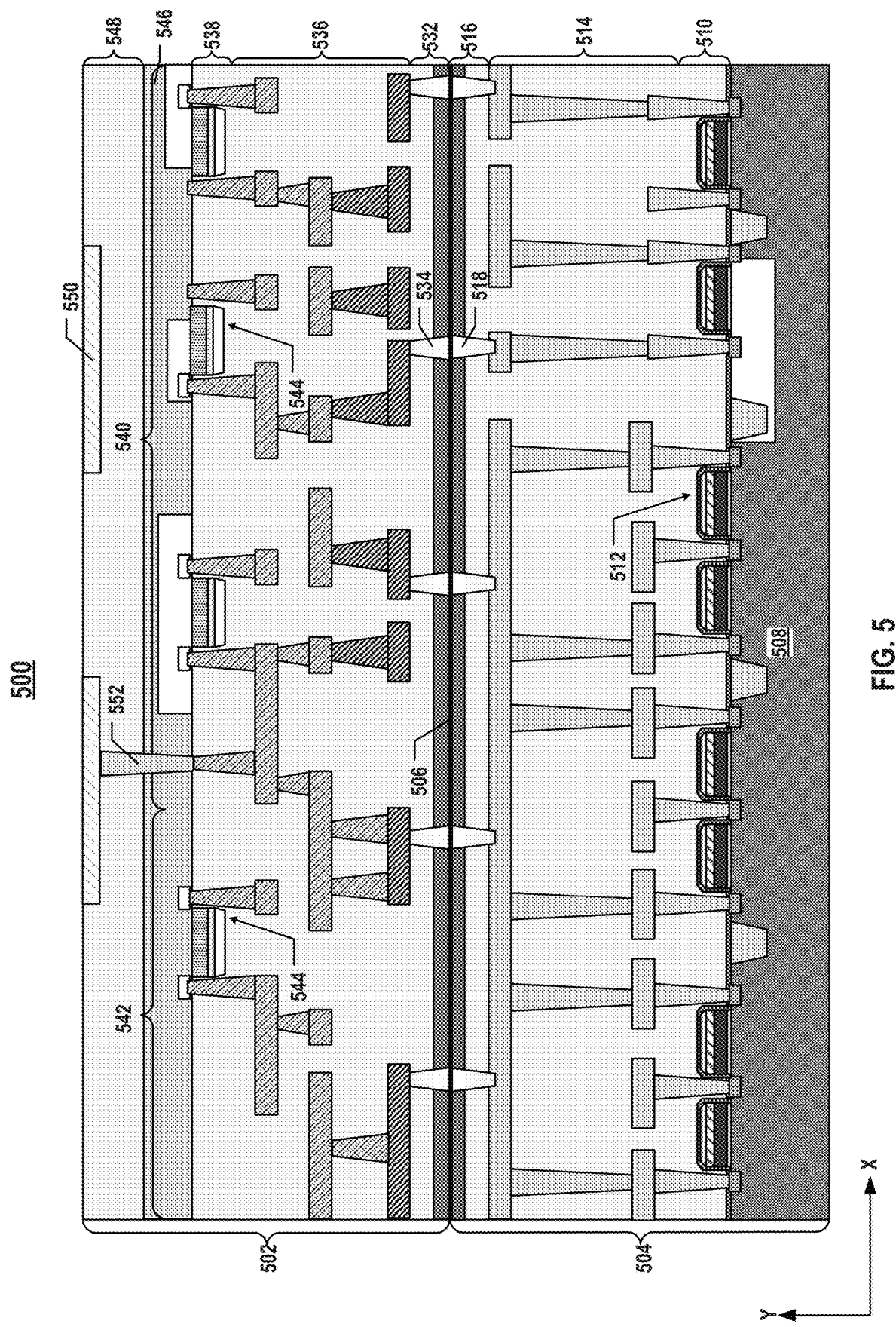
FIG. 5 illustrates a cross-section of another exemplary semiconductor device, according to some embodiments.

FIG. 5 illustrates a cross-section of another exemplary semiconductor device 500, according to some embodiments. As one example of semiconductor device 101 described above with respect to FIG. 1B, semiconductor device 500 is a bonded chip including a second semiconductor structure 504 and a first semiconductor structure 502 stacked over second semiconductor structure 504. Similar to semiconductor device 400 described above in FIG. 4, semiconductor device 500 represents an example of a bonded chip in which first semiconductor structure 502 including a processor and second semiconductor structure 504 including SRAM are formed separately and bonded in a face-to-face manner at a bonding interface 506. Different from semiconductor device 400 described above in FIG. 4 in which first semiconductor structure 402 including the processor is below second semiconductor structure 404 including the SRAM, semiconductor device 500 in FIG. 5 includes first semiconductor structure 502 including the processor disposed above second semiconductor structure 504 including the SRAM. It is understood that the details of similar structures (e.g., materials, fabrication processes, functions, etc.) in both semiconductor devices 400 and 500 may not be repeated below.

Second semiconductor structure 504 of semiconductor device 500 can include a substrate 508 and an array of SRAM cells 510 on substrate 508. In some embodiments, each SRAM cell 510 includes a plurality of transistors 512. SRAM cell 510 can be a 6T cell consisting of four storage transistor and two access transistors. It is understood that SRAM cell 510 may be of any suitable configuration, such as more or fewer than six transistors (e.g., more or fewer transistors per bit). In some embodiments, transistors 512 are formed "on" substrate 508, in which the entirety or part of transistors 512 are formed in substrate 508 and/or directly on substrate 508. It is understood that the structure and configuration of SRAM cell 510 are not limited to the example in FIG. 5 and may include any suitable structure and configuration.

In some embodiments, second semiconductor structure 504 of semiconductor device 500 also includes an interconnect layer 514 above array of SRAM cells 510 to transfer electrical signals to and from array of SRAM cells 510. Interconnect layer 514 can include a plurality of interconnects, including interconnect lines and via contacts. In some embodiments, interconnects in interconnect layer 514 also include local interconnects, such as bit line contacts and word line contacts. In some embodiments, second semiconductor structure 504 of semiconductor device 500 further includes a bonding layer 516 at bonding interface 506 and above interconnect layer 514 and array of SRAM cells 510. Bonding layer 516 can include a plurality of bonding contacts 518 and dielectrics surrounding and electrically isolating bonding contacts 518.

As shown in FIG. 5, first semiconductor structure 502 of semiconductor device 500 includes another bonding layer 532 at bonding interface 506 and above bonding layer 516. Bonding layer 532 can include a plurality of bonding contacts 534 and dielectrics surrounding and electrically isolating bonding contacts 534. Bonding contacts 534 are in contact with bonding contacts 518 at bonding interface 506, according to some embodiments. In some embodiments, first semiconductor structure 502 of semiconductor device 500 also includes an interconnect layer 536 above bonding layer 532 to transfer electrical signals. Interconnect layer 536 can include a plurality of interconnects, including interconnect lines and via contacts.

First semiconductor structure 502 of semiconductor device 500 can further include a device layer 538 above interconnect layer 536 and bonding layer 532. In some embodiments, device layer 538 includes a processor 540 above interconnect layer 536 and bonding layer 532. In some embodiments, device layer 538 further includes other logic circuits 542 above interconnect layer 536 and bonding layer 532 and outside of processor 540. For example, other logic circuits 542 may include interface circuits and/or part or the entirety of the peripheral circuits for controlling and sensing array of SRAM cells 510. In some embodiments, the devices in device layer 538 are electrically connected to one another through the interconnects in interconnect layer 536. For example, other logic circuits 542 may be electrically connected to processor 540 through interconnect layer 536.

In some embodiments, processor 540 includes a plurality of transistors 544 forming any suitable specialized processor cores and/or SoC cores. Transistors 544 can be formed "on" a semiconductor layer 546, in which the entirety or part of transistors 544 are formed in semiconductor layer 546 and/or directly on semiconductor layer 546. Isolation regions (e.g., STIs) and doped regions (e.g., source regions and drain regions of transistors 544) can be formed in semiconductor layer 546 as well. Transistors 544 can form other logic circuits 542 as well. Transistors 544 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, first semiconductor structure 502 further includes semiconductor layer 546 disposed above device layer 538. Semiconductor layer 546 can be above and in contact with processor 540 and other logic circuits 542. Semiconductor layer 546 can be a thinned substrate on which transistors 544 are formed. In some embodiments, semiconductor layer 546 includes single-crystal silicon. In some embodiments, semiconductor layer 546 can include polysilicon, amorphous silicon, SiGe, GaAs, Ge, Salicide, or any other suitable materials. Semiconductor layer 546 can also include isolation regions and doped regions.

As shown in FIG. 5, first semiconductor structure 502 of semiconductor device 500 can further include a pad-out interconnect layer 548 above semiconductor layer 546. Pad-out interconnect layer 548 can include interconnects, e.g., contact pads 550, in one or more ILD layers. In some embodiments, interconnects in pad-out interconnect layer 548 can transfer electrical signals between semiconductor device 500 and outside circuits, e.g., for pad-out purposes. In some embodiments, first semiconductor structure 502 further includes one or more contacts 552 extending through semiconductor layer 546 to electrically connect pad-out interconnect layer 548 and interconnect layers 536 and 514. As a result, processor 540 and array of SRAM cells 510 (and other logic circuits 542 if any) can be electrically connected to outside circuits through contacts 552 and pad-out interconnect layer 548.

Moreover, processor 540 (and other logic circuits 542 if any) can also be electrically connected to array of SRAM cells 510 through interconnect layers 536 and 514 as well as bonding contacts 534 and 518. By vertically integrating processor 540 and array of SRAM cells 510, the interconnect distance can be significantly reduced compared with laterally arranging processor 540 and array of SRAM cells 510 in the same plane of a microprocessor chip, which has a chip size in the centimeter-level. The vertical distance between processor 540 and array of SRAM cells 510 is less than 1 mm, according to some embodiments. In one example, the vertical distance between processor 540 and array of SRAM cells 510 is between 1 μm and 1 mm (e.g., 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, any range bounded by the lower end by any of these values, or in any range defined by any two of these values).

Figure 7A:
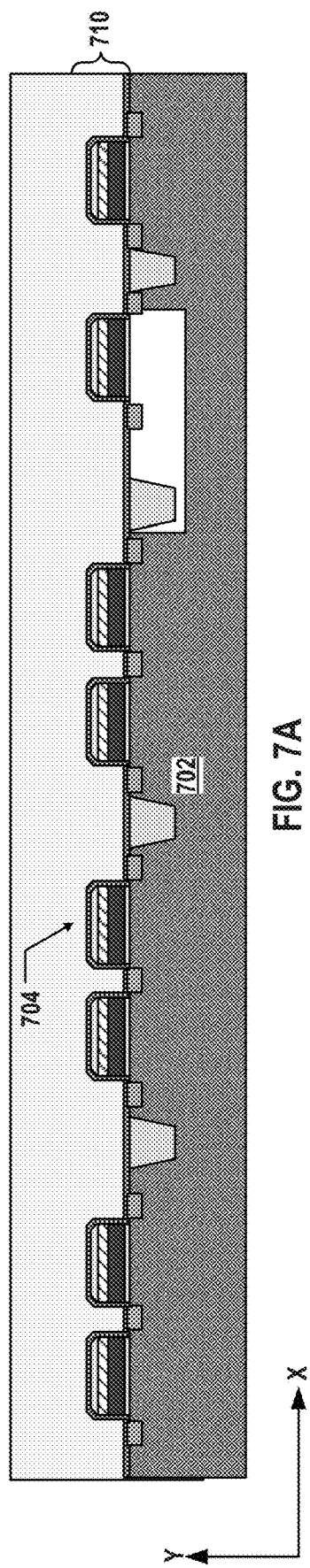
FIGS. 7A and 7B illustrate a fabrication process for forming an exemplary semiconductor structure having SRAM, according to some embodiments.
Figure 7B:
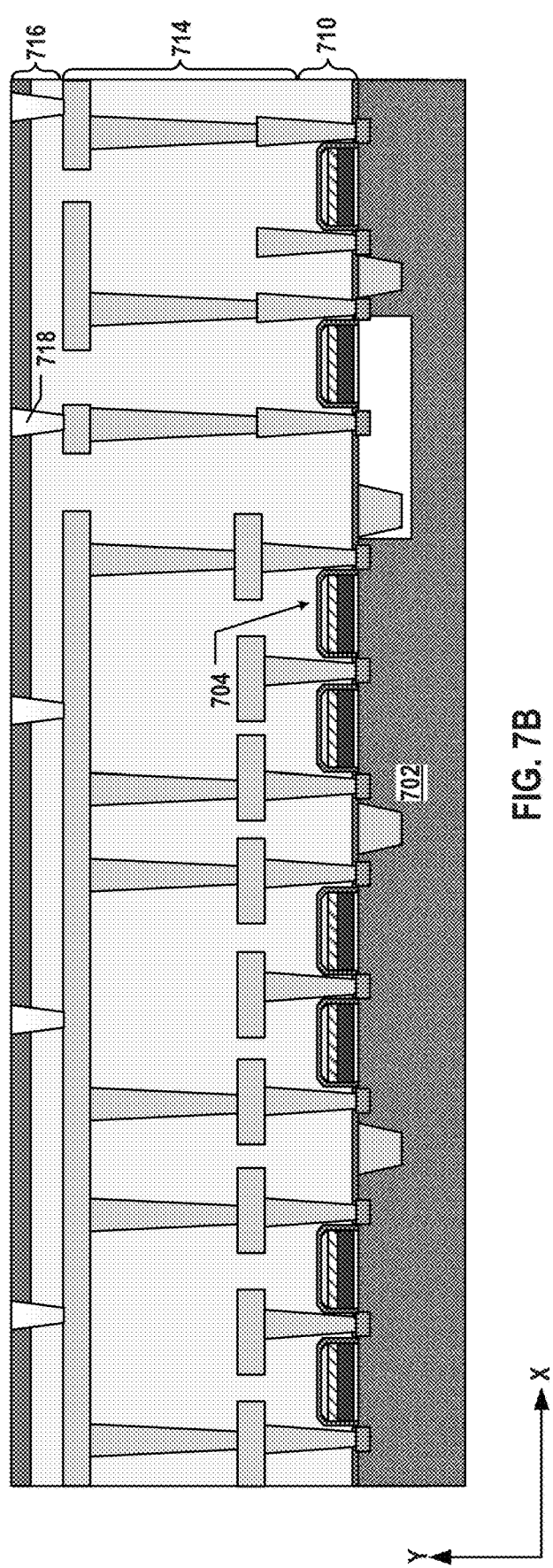
Figure 8A:
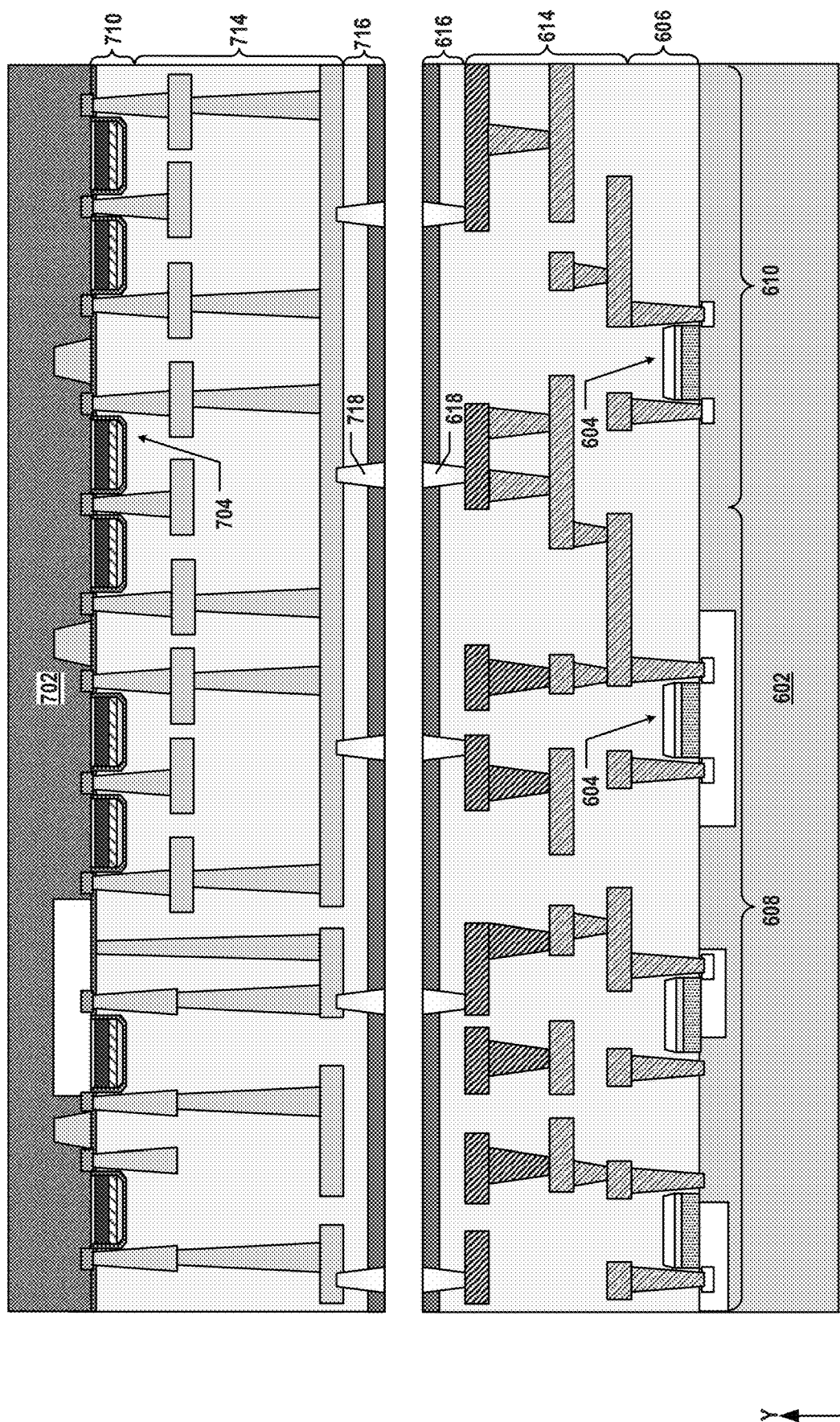
FIGS. 8A and 8B illustrate a fabrication process for forming an exemplary semiconductor device, according to some embodiments.
Figure 8B:
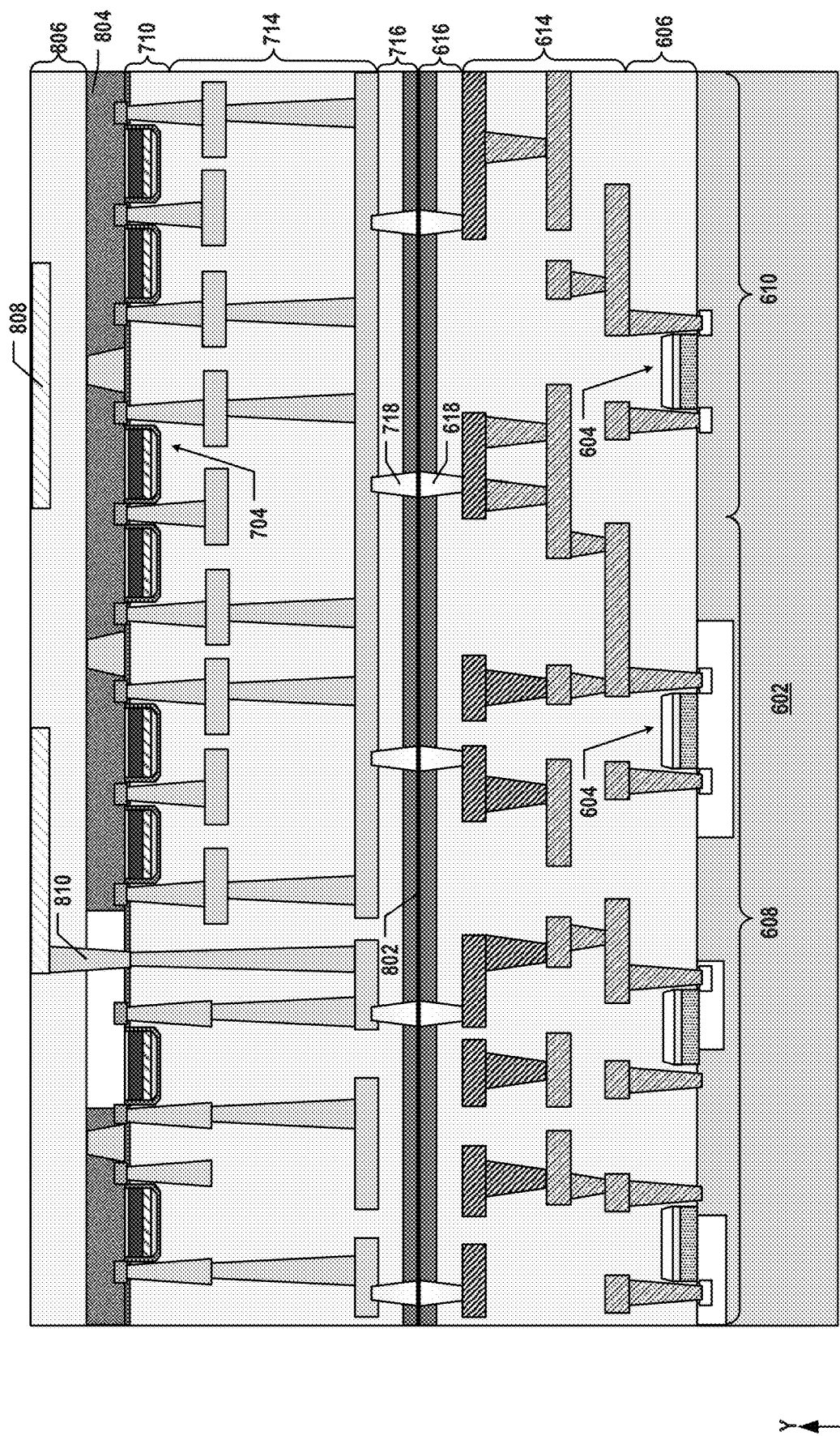
Figure 9A:
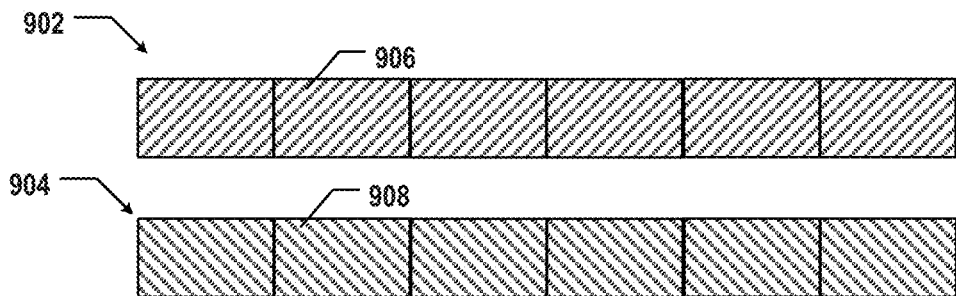
FIGS. 9A-9C illustrate a fabrication process for bonding and dicing an exemplary semiconductor structure, according to some embodiments.
Figure 9B:
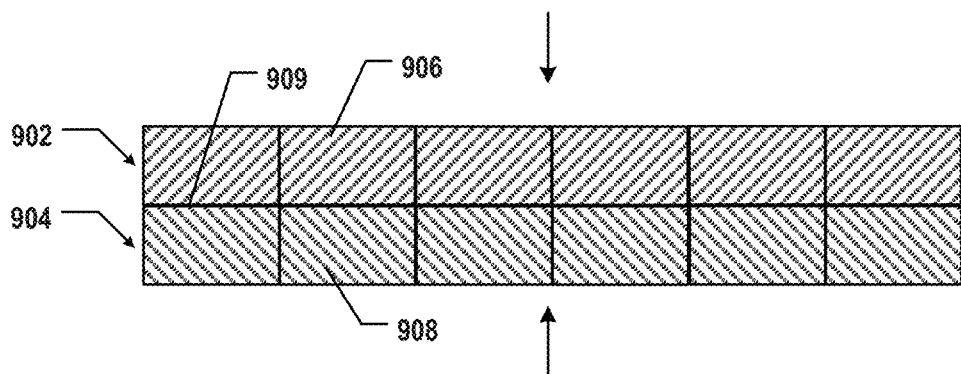
Figure 9C:
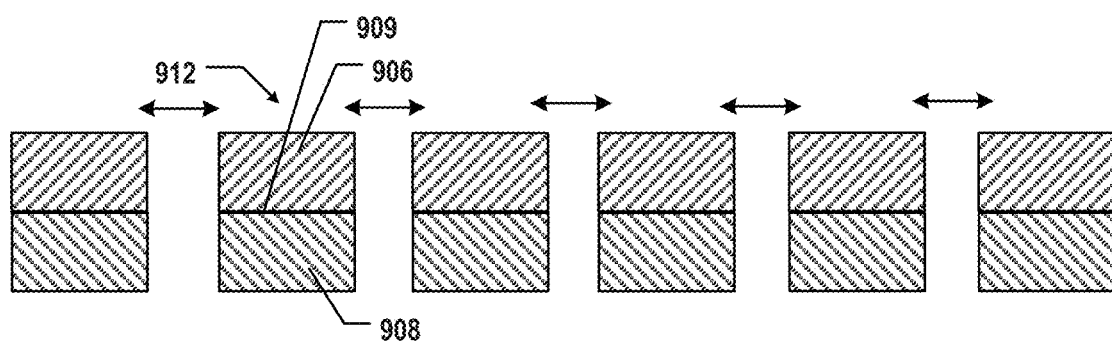
Figure 10A:
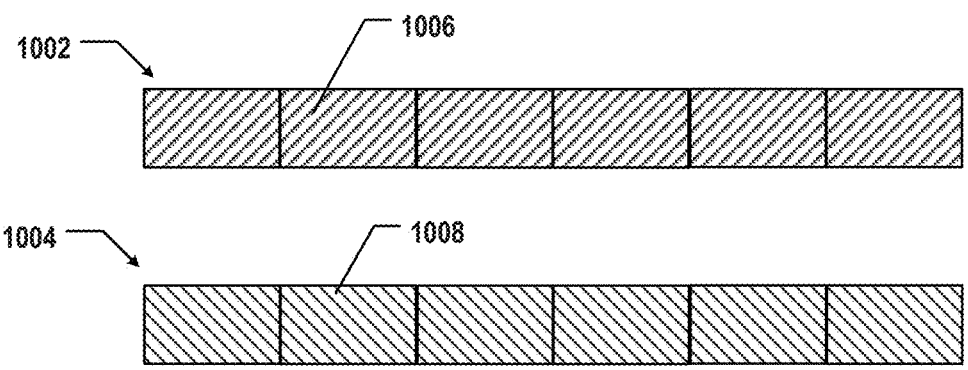
FIGS. 10A-10C illustrate a fabrication process for dicing and bonding an exemplary semiconductor structure, according to some embodiments.
Figure 10B:
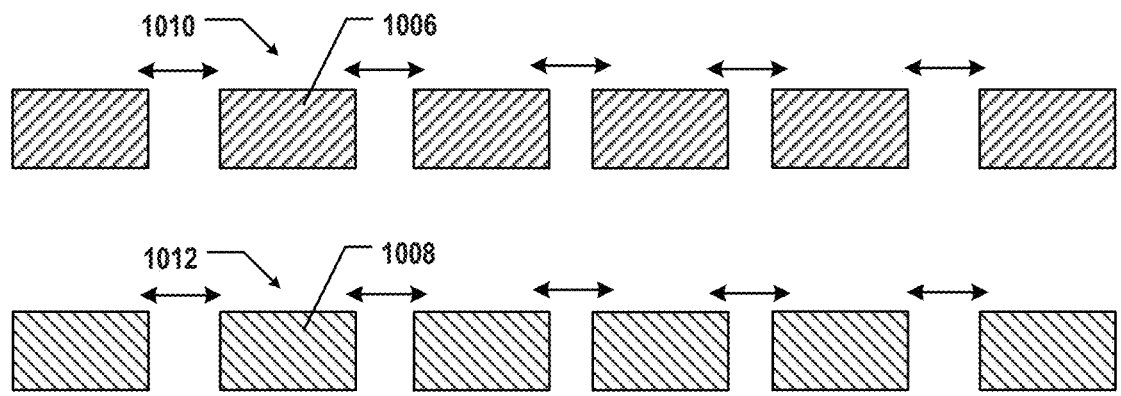
Figure 10C:
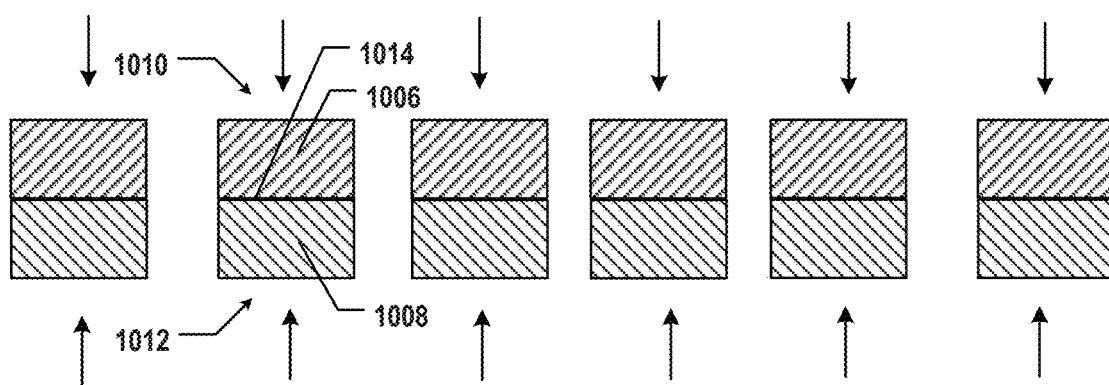
Figure 11:
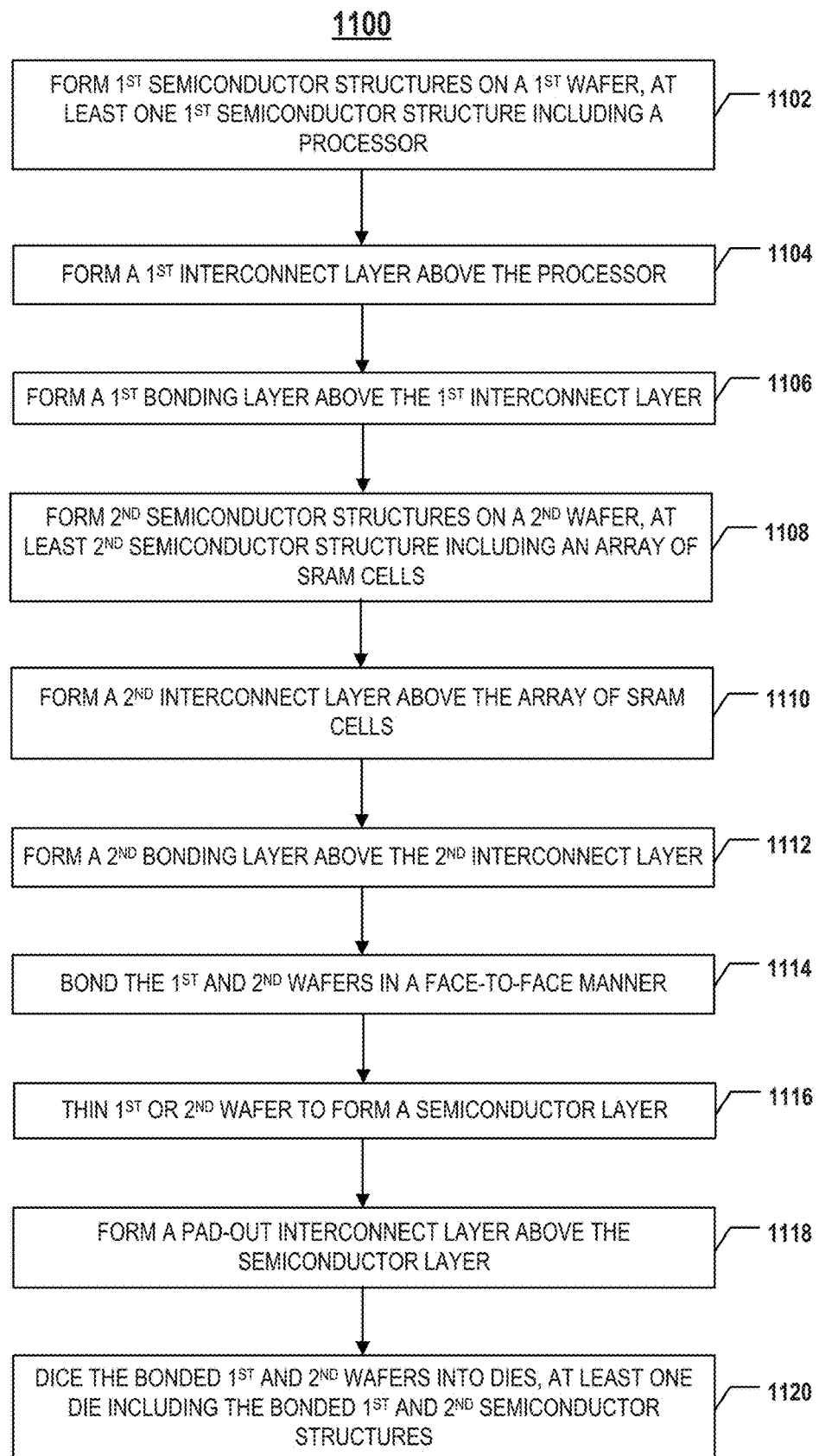
FIG. 11 is a flowchart of an exemplary method for forming a semiconductor device, according to some embodiments.
Figure 12:
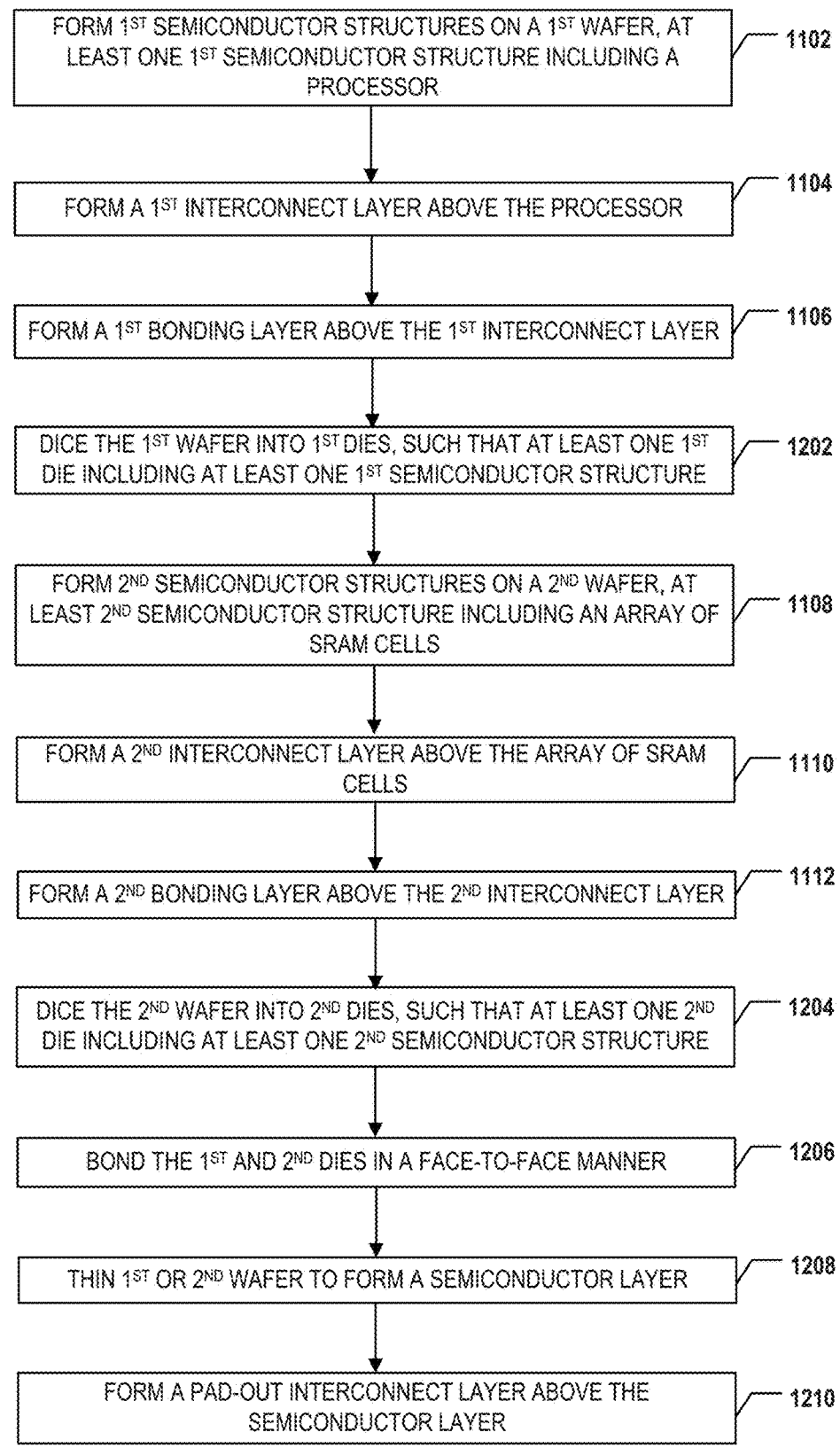
FIG. 12 is a flowchart of another exemplary method for forming a semiconductor device, according to some embodiments.

FIGS. 6A and 6B illustrate a fabrication process for forming an exemplary semiconductor structure having a processor and other logic circuits, according to some embodiments. FIGS. 7A and 7B illustrate a fabrication process for forming an exemplary semiconductor structure having SRAM, according to some embodiments. FIGS. 8A and 8B illustrate a fabrication process for forming an exemplary semiconductor device, according to some embodiments. FIGS. 9A-9C illustrate a fabrication process for bonding and dicing an exemplary semiconductor structure, according to some embodiments. FIGS. 10A-10C illustrate a fabrication process for dicing and bonding an exemplary semiconductor structure, according to some embodiments. FIG. 11 is a flowchart of an exemplary method 1100 for forming a semiconductor device, according to some embodiments. FIG. 12 is a flowchart of another exemplary method 1200 for forming a semiconductor device, according to some embodiments. Examples of the semiconductor device depicted in FIGS. 6A, 6B, 7A, 7B, 8A, 8B, 9A-9C, 10A-10C, 11, and 12 include semiconductor devices 400 and 500 depicted in FIGS. 4 and 5, respectively. FIGS. 6A, 6B, 7A, 7B, 8A, 8B, 9A-9C, 10A-10C, 11, and 12 will be described together. It is understood that the operations shown in methods 1100 and 1200 are not exhaustive and that other operations can be performed as well before, after, or between any of the illustrated operations. Further, some of the operations may be performed simultaneously, or in a different order than shown in FIGS. 11 and 12.

As depicted in FIGS. 6A and 6B, a first semiconductor structure including a processor, other logic circuits, and a first bonding layer including a plurality of first bonding contacts is formed. As depicted in FIGS. 7A and 7B, a second semiconductor structure including an array of SRAM cells and a second bonding layer including a plurality of second bonding contacts is formed. As depicted in FIGS. 8A and 8B, the first semiconductor structure and the second semiconductor structure are bonded in a face-to-face manner, such that the first bonding contacts are in contact with the second bonding contacts at a bonding interface.

Referring to FIG. 11, method 1100 starts at operation 1102, in which a plurality of first semiconductor structures are formed on a first wafer. At least one of the first semiconductor structures includes a processor and a first bonding layer including a plurality of first bonding contacts. The first wafer can be a silicon wafer. In some embodiments, to form the plurality of first semiconductor structures, the processor is formed on the first wafer. In some embodiments, to form the processor, a plurality of transistors are formed on the first wafer. In some embodiments, to form the plurality of first semiconductor structures, a peripheral circuit of the array of SRAM cells is also formed on the first wafer. In some embodiments, to form the plurality of first semiconductor structures, an interface circuit is also formed on the first wafer.

As illustrated in FIG. 9A, a plurality of first semiconductor structures 906 are formed on a first wafer 902. First wafer 902 can include a plurality of shots separated by scribing lines. Each shot of first wafer 902 includes one or more first semiconductor structures 906, according to some embodiments. FIGS. 6A and 6B illustrate one example of the formation of first semiconductor structure 906.

As illustrated in FIG. 6A, a plurality of transistors 604 are formed on a silicon substrate 602 (as part of first wafer 902, e.g., a silicon wafer). Transistors 604 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 602 by ion implantation and/or thermal diffusion, which function, for example, as source regions and/or drain regions of transistors 604. In some embodiments, isolation regions (e.g., STIs) are also formed in silicon substrate 602 by wet/dry etch and thin film deposition. Transistors 604 can form a device layer 606 on silicon substrate 602. In some embodiments, device layer 606 includes a processor 608 and other logic circuits 610. Logic circuits 610 can include a peripheral circuit of SRAM and an interface circuit, such as a bus circuit or an I/O circuit.

Method 1100 proceeds to operation 1104, as illustrated in FIG. 11, in which a first interconnect layer is formed above the processor. The first interconnect layer can include a first plurality of interconnects in one or more ILD layers. As illustrated in FIG. 6B, an interconnect layer 614 can be formed above device layer 606 including processor 608 and other logic circuits 610. Interconnect layer 614 can include interconnects of MEOL and/or BEOL in a plurality of ILD layers to make electrical connections with device layer 606. In some embodiments, interconnect layer 614 includes multiple ILD layers and interconnects therein formed in multiple processes. For example, the interconnects in interconnect layers 614 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 614.

Method 1100 proceeds to operation 1106, as illustrated in FIG. 11, in which a first bonding layer is formed above the first interconnect layer. The first bonding layer can include a plurality of first bonding contacts. As illustrated in FIG. 6B, a bonding layer 616 is formed above interconnect layer 614. Bonding layer 616 can include a plurality of bonding contacts 618 surrounded by dielectrics. In some embodiments, a dielectric layer is deposited on the top surface of interconnect layer 614 by one or more thin film deposition processes including, but not limited to, CVD, PVD, ALD, or any combination thereof. Bonding contacts 618 then can be formed through the dielectric layer and in contact with the interconnects in interconnect layer 614 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1100 proceeds to operation 1108, as illustrated in FIG. 11, in which a plurality of second semiconductor structures are formed on a second wafer. At least one of the second semiconductor structures includes an array of SRAM cells and a second bonding layer including a plurality of second bonding contacts. The second wafer can be a silicon wafer. In some embodiments, to form the plurality of second semiconductor structures, the array of SRAM cells are formed on the second wafer. In some embodiments, to form the array of SRAM cells, a plurality of transistors are formed on the second wafer.

As illustrated in FIG. 9A, a plurality of second semiconductor structures 908 are formed on a second wafer 904. Second wafer 904 can include a plurality of shots separated by scribing lines. Each shot of second wafer 904 includes one or more second semiconductor structures 908, according to some embodiments. FIGS. 7A and 7B illustrate one example of the formation of second semiconductor structure 908.

As illustrated in FIG. 7A, a plurality of transistors 704 are formed on a silicon substrate 702 (as part of second wafer 904, e.g., a silicon wafer). Transistors 704 can be formed by a plurality of processes including, but not limited to, photolithography, dry/wet etch, thin film deposition, thermal growth, implantation, CMP, and any other suitable processes. In some embodiments, doped regions are formed in silicon substrate 702 by ion implantation and/or thermal diffusion, which function, for example, as source regions and/or drain regions of transistors 704. In some embodiments, isolation regions (e.g., STIs) are also formed in silicon substrate 702 by wet/dry etch and thin film deposition. An array of SRAM cells 710 (each having a plurality of transistors 704) are thereby formed.

Method 1100 proceeds to operation 1110, as illustrated in FIG. 11, in which a second interconnect layer is formed above the array of SRAM cells. The second interconnect layer can include a second plurality of interconnects in one or more ILD layers. As illustrated in FIG. 7B, an interconnect layer 714 can be formed above array of SRAM cells 710. Interconnect layer 714 can include interconnects of MEOL and/or BEOL in a plurality of ILD layers to make electrical connections with array of SRAM cells 710. In some embodiments, interconnect layer 714 includes multiple ILD layers and interconnects therein formed in multiple processes. For example, the interconnects in interconnect layers 714 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7B can be collectively referred to as interconnect layer 714.

Method 1100 proceeds to operation 1112, as illustrated in FIG. 11, in which a second bonding layer is formed above the second interconnect layer. The second bonding layer can include a plurality of second bonding contacts. As illustrated in FIG. 7B, a bonding layer 716 is formed above interconnect layer 714. Bonding layer 716 can include a plurality of bonding contacts 718 surrounded by dielectrics. In some embodiments, a dielectric layer is deposited on the top surface of interconnect layer 714 by one or more thin film deposition processes including, but not limited to, CVD, PVD, ALD, or any combination thereof. Bonding contacts 718 then can be formed through the dielectric layer and in contact with the interconnects in interconnect layer 714 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1100 proceeds to operation 1114, as illustrated in FIG. 11, in which the first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonding can be hybrid bonding. In some embodiments, the second semiconductor structure is above the first semiconductor structure after the bonding. In some embodiments, the first semiconductor structure is above the second semiconductor structure after the bonding.

As illustrated in FIG. 9B, first wafer 902 and second wafer 904 are bonded in a face-to-face manner, such that at least one of first semiconductor structures 906 is bonded to at least one of second semiconductor structures 908 at a bonding interface 909. Although first wafer 902 is above second wafer 904 after the bonding as shown in FIG. 9B, it is understood that second wafer 904 may be above first wafer 902 after the bonding in some embodiments. FIG. 8A illustrates one example of the formation of bonded first and second semiconductor structures 906 and 908.

As illustrated in FIG. 8A, silicon substrate 702 and components formed thereon (e.g., array of SRAM cells 710) are flipped upside down. Bonding layer 716 facing down is bonded with bonding layer 616 facing up, i.e., in a face-to-face manner, thereby forming a bonding interface 802 (as shown in FIG. 8B). In some embodiments, a treatment process, e.g., a plasma treatment, a wet treatment, and/or a thermal treatment, is applied to the bonding surfaces prior to the bonding. Although not shown in FIG. 8A, silicon substrate 602 and components formed thereon (e.g., device layer 606 including processor 608 and other logic circuits 610) can be flipped upside down, and bonding layer 616 facing down can be bonded with bonding layer 716 facing up, i.e., in a face-to-face manner, thereby forming bonding interface 802. After the bonding, bonding contacts 718 in bonding layer 716 and bonding contacts 618 in bonding layer 616 are aligned and in contact with one another, such that array of SRAM cells 710 can be electrically connected to device layer 606 (e.g., processor 608 and other logic circuits 610). It is understood that in the bonded chip, device layer 606 (e.g., processor 608 and other logic circuits 610) may be either above or below array of SRAM cells 710. Nevertheless, bonding interface 802 can be formed between device layer 606 (e.g., processor 608 and other logic circuits 610) and array of SRAM cells 710 after the bonding as illustrated in FIG. 8B.

Method 1100 proceeds to operation 1116, as illustrated in FIG. 11, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as a semiconductor layer 804, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 702 can be thinned by processes including, but not limited to, wafer grinding, dry etch, wet etch, CMP, any other suitable processes, or any combination thereof. It is understood that when silicon substrate 602 is the substrate at the top of the bonded chip, another semiconductor layer may be formed by thinning silicon substrate 602.

Method 1100 proceeds to operation 1118, as illustrated in FIG. 11, in which a pad-out interconnect layer is formed above the semiconductor layer. As illustrated in FIG. 8B, a pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example by wet/dry etch followed by depositing conductive materials. Contacts 810 can be in contact with the interconnects in pad-out interconnect layer 806.

Method 1100 proceeds to operation 1120, as illustrated in FIG. 11, in which the bonded first and second wafers are diced into a plurality of dies. At least one of the dies includes the bonded first and second semiconductor structures. As illustrated in FIG. 9C, bonded first and second wafers 902 and 904 (as shown in FIG. 9B) are diced into a plurality of dies 912. At least one of dies 912 includes bonded first and second semiconductor structures 906 and 908. In some embodiments, each shot of bonded first and second wafers 902 and 904 is cut from bonded first and second wafers 902 and 904 along the scribing lines using wafer laser dicing and/or mechanical dicing techniques, thereby becoming respective die 912. Die 912 can include bonded first and second semiconductor structures 906 and 908, for example, the bonded structure as shown in FIG. 8B.

Instead of packaging scheme based on wafer-level bonding before dicing as described above with respect to FIGS. 9A-9C and 11, FIGS. 10A-10C and 12 illustrate another packaging scheme based on die-level bonding after dicing, according to some embodiments. Operations 1102, 1104, and 1106 of method 1200 in FIG. 12 are described above with respect to method 1100 in FIG. 11 and thus, are not repeated. As illustrated in FIG. 10A, a plurality of first semiconductor structures 1006 are formed on a first wafer 1002. First wafer 1002 can include a plurality of shots separated by scribing lines. Each shot of first wafer 1002 includes one or more first semiconductor structures 1006, according to some embodiments. FIGS. 6A and 6B illustrate one example of the formation of first semiconductor structure 1006.

Method 1200 proceeds to operation 1202, as illustrated in FIG. 12, in which the first wafer is diced into a plurality of first dies, such that at least one of the first dies includes the at least one of the first semiconductor structures. As illustrated in FIG. 10B, first wafer 1002 (as shown in FIG. 10A) is diced into a plurality of dies 1010, such that at least one die 1010 includes first semiconductor structure 1006. In some embodiments, each shot of first wafer 1002 is cut from first wafer 1002 along the scribing lines using wafer laser dicing and/or mechanical dicing techniques, thereby becoming respective die 1010. Die 1010 can include first semiconductor structure 1006, for example, the structure as shown in FIG. 6B.

Operations 1108, 1110, and 1112 of method 1200 in FIG. 12 are described above with respect to method 1100 in FIG. 11 and thus, are not repeated. As illustrated in FIG. 10A, a plurality of second semiconductor structures 1008 are formed on a second wafer 1004. Second wafer 1004 can include a plurality of shots separated by scribing lines. Each shot of second wafer 1004 includes one or more second semiconductor structures 1008, according to some embodiments. FIGS. 7A and 7B illustrate one example of the formation of second semiconductor structure 1008.

Method 1200 proceeds to operation 1204, as illustrated in FIG. 12, in which the second wafer is diced into a plurality of second dies, such that at least one of the second dies includes the at least one of the second semiconductor structures. As illustrated in FIG. 10B, second wafer 1004 (as shown in FIG. 10A) is diced into a plurality of dies 1012, such that at least one die 1012 includes second semiconductor structure 1008. In some embodiments, each shot of second wafer 1004 is cut from second wafer 1004 along the scribing lines using wafer laser dicing and/or mechanical dicing techniques, thereby becoming respective die 1012. Die 1012 can include second semiconductor structure 1008, for example, the structure as shown in FIG. 7B.

Method 1200 proceeds to operation 1206, as illustrated in FIG. 12, in which the first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface. As illustrated in FIG. 10C, die 1010 including first semiconductor structure 1006 and die 1012 including second semiconductor structure 1008 are bonded in a face-to-face manner, such that first semiconductor structure 1006 is bonded to second semiconductor structure 1008 at a bonding interface 1014. Although first semiconductor structure 1006 is above second semiconductor structure 1008 after the bonding as shown in FIG. 10C, it is understood that second semiconductor structure 1008 may be above first semiconductor structure 1006 after the bonding in some embodiments. FIG. 8A illustrates one example of the formation of bonded first and second semiconductor structures 1006 and 1008.

Method 1200 proceeds to operation 1208, as illustrated in FIG. 12, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as semiconductor layer 804, for example, a single-crystal silicon layer. Silicon substrate 702 can be thinned by processes including, but not limited to, wafer grinding, dry etch, wet etch, CMP, any other suitable processes, or any combination thereof. In one example, the thickness of the thinned substrate may be between about 1 µm and about 20 µm, such as between 1 µm and 20 µm (e.g., 1 µm, 2 µm, 3 µm, 4 µm, 5 µm, 6 µm, 7 µm, 8 µm, 9 µm, 10 µm, 15 µm, 20 µm, any range bounded by the lower end by any of these values, or in any range defined by any two of these values), for example, using a combination of etch and CMP processes. It is understood that in some embodiments, by further applying an additional etch process, the thickness of the thinned substrate may be further reduced to below 1 µm, e.g., in the sub-micron range. It is understood that when silicon substrate 602 is the substrate at the top of the bonded chip, another semiconductor layer may be formed by thinning silicon substrate 602.

Method 1200 proceeds to operation 1210, as illustrated in FIG. 12, in which a pad-out interconnect layer is formed above the semiconductor layer. As illustrated in FIG. 8B, pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example, by wet/dry etch followed by depositing conductive materials. Contacts 810 can be in contact with the interconnects in pad-out interconnect layer 806.

According to one aspect of the present disclosure, a semiconductor device includes a first semiconductor structure including a processor and a first bonding layer including a plurality of first bonding contacts. The semiconductor device also includes a second semiconductor structure including an array of SRAM cells and a second bonding layer including a plurality of second bonding contacts. The semiconductor device further includes a bonding interface between the first bonding layer and the second bonding layer. The first bonding contacts are in contact with the second bonding contacts at the bonding interface.

In some embodiments, the first semiconductor structure does not include an SRAM cell, and the second semiconductor structure does not include a processor.

In some embodiments, the first semiconductor structure includes a substrate, the processor on the substrate, and the first bonding layer above the processor and the array of SRAM cells.

In some embodiments, the second semiconductor structure includes the second bonding layer above the first bonding layer, the array of SRAM cells above the second bonding layer, and a semiconductor layer above and in contact with the array of SRAM cells.

In some embodiments, the semiconductor device further includes a pad-out interconnect layer above the semiconductor layer. In some embodiments, the semiconductor layer includes single-crystal silicon.

In some embodiments, the second semiconductor structure includes a substrate, the array of SRAM cells on the substrate, and the second bonding layer above the array of SRAM cells.

In some embodiments, the first semiconductor structure includes the first bonding layer above the second bonding layer, the processor above the first bonding layer, and a semiconductor layer above and in contact with the processor.

In some embodiments, the semiconductor device further includes a pad-out interconnect layer above the semiconductor layer. In some embodiments, the semiconductor layer includes single-crystal silicon.

In some embodiments, the first semiconductor structure further includes a peripheral circuit of the array of SRAM cells. In some embodiments, the first semiconductor structure further includes an interface circuit. In some embodiments, the processor includes a plurality of cores.

In some embodiments, the first semiconductor structure includes a first interconnect layer vertically between the first bonding layer and the processor, and the second semiconductor structure includes a second interconnect layer vertically between the second bonding layer and the array of SRAM cells.

In some embodiments, the processor is electrically connected to the array of SRAM cells through the first and second interconnect layers and the first and second bonding contacts.

In some embodiments, a vertical distance between the processor and the array of SRAM cells is less than 1 mm.

According to another aspect of the present disclosure, a method for forming a semiconductor device is disclosed. A plurality of first semiconductor structures are formed on a first wafer. At least one of the first semiconductor structures includes a processor and a first bonding layer including a plurality of first bonding contacts. A plurality of second semiconductor structures are formed on a second wafer. At least one of the second semiconductor structures includes an array of SRAM cells and a second bonding layer including a plurality of second bonding contacts. The first wafer and the second wafer in are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In some embodiments, to form the plurality of first semiconductor structures, the processor is formed on the first wafer, a first interconnect layer is formed above the processor, and the first bonding layer is formed above the first interconnect layer. In some embodiments, to form the processor, a plurality of transistors are formed on the first wafer.

In some embodiments, to form the plurality of first semiconductor structures, a peripheral circuit of the array of SRAM cells is formed on the first wafer. In some embodiments, to form the plurality of first semiconductor structures, an interface circuit is formed on the first wafer.

In some embodiments, to form the plurality of second semiconductor structures, the array of SRAM cells are formed on the second wafer, a second interconnect layer is formed above the array of SRAM cells, and the second bonding layer is formed above the second interconnect layer.

In some embodiments, to form the array of SRAM cells, a plurality of transistors are formed on the second wafer.

In some embodiments, the second semiconductor structure is above the first semiconductor structure after the bonding. In some embodiments, after the bonding and prior to the dicing, the second wafer is thinned to form a semiconductor layer, and a pad-out interconnect layer is formed above the semiconductor layer.

In some embodiments, the first semiconductor structure is above the second semiconductor structure after the bonding. In some embodiments, after the bonding and prior to the dicing, the first wafer is thinned to form a semiconductor layer, and a pad-out interconnect layer is formed above the semiconductor layer.

In some embodiments, the bonding includes hybrid bonding.

According to still another aspect of the present disclosure, a method for forming a semiconductor device is disclosed. A plurality of first semiconductor structures are formed on a first wafer. At least one of the first semiconductor structures includes a processor and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of SRAM cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

In some embodiments, to form the plurality of first semiconductor structures, the processor is formed on the first wafer, a first interconnect layer is formed above the processor, and the first bonding layer is formed above the first interconnect layer. In some embodiments, to form the processor, a plurality of transistors are formed on the first wafer.

In some embodiments, to form the plurality of first semiconductor structures, a peripheral circuit of the array of SRAM cells is formed on the first wafer. In some embodiments, to form the plurality of first semiconductor structures, an interface circuit is formed on the first wafer.

In some embodiments, to form the plurality of second semiconductor structures, the array of SRAM cells are formed on the second wafer, a second interconnect layer is formed above the array of SRAM cells, and the second bonding layer is formed above the second interconnect layer.

In some embodiments, to form the array of SRAM cells, a plurality of transistors are formed on the second wafer.

In some embodiments, the second semiconductor structure is above the first semiconductor structure after the bonding. In some embodiments, the second wafer is thinned to form a semiconductor layer after the bonding, and a pad-out interconnect layer is formed above the semiconductor layer.

In some embodiments, the first semiconductor structure is above the second semiconductor structure after the bonding.

In some embodiments, the first wafer is thinned to form a semiconductor layer after the bonding, and a pad-out interconnect layer is formed above the semiconductor layer.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
   forming a plurality of first semiconductor structures on a first wafer, wherein a first one of the first semiconductor structures comprises a processor free of a cache memory, a second one of the first semiconductor structures comprises a row decoder, and a third one of the first semiconductor structures is a column decoder;
   forming a first bonding layer comprising a plurality of first bonding contacts above the plurality of first semiconductor structures;
   forming a plurality of second semiconductor structures on a second wafer, wherein at least one of the second semiconductor structures comprises an array of static random-access memory (SRAM) cells free of a decoder circuit;
   forming a second bonding layer comprising a plurality of second bonding contacts above the plurality of second semiconductor structures;
   bonding the first wafer and the second wafer in a face-to-face manner, such that the row decoder and the column decoder of the first semiconductor structures are electrically coupled to the array of SRAM cells through the first and second bonding contacts, wherein the first bonding contacts are in contact with the second bonding contacts at a bonding interface; and
   dicing the bonded first and second wafers into a plurality of dies, wherein at least one of the dies comprises the bonded first and second semiconductor structures.

2. The method of claim 1, further comprising:
   forming a first interconnect layer above the processor,
   wherein the first bonding layer is disposed above the first interconnect layer.

3. The method of claim 2, wherein forming the plurality of first semiconductor structures further comprises forming, on the first wafer, a peripheral circuit of the array of SRAM cells of the second wafer.

4. The method of claim 1, further comprising:
   forming a second interconnect layer above the array of SRAM cells,
   wherein the second bonding layer is disposed above the second interconnect layer.

5. The method of claim 1, wherein
   the plurality of second semiconductor structures are above the plurality of first semiconductor structures after the bonding; and
   the method further comprises, after the bonding and prior to the dicing:
   thinning the second wafer to form a semiconductor layer; and
   forming a pad-out interconnect layer above the semiconductor layer.

6. The method of claim 1, wherein
   the plurality of first semiconductor structures are above the plurality of second semiconductor structures after the bonding; and
   the method further comprises, after the bonding and prior to the dicing:
   thinning the first wafer to form a semiconductor layer; and
   forming a pad-out interconnect layer above the semiconductor layer.

7. The method of claim 1, wherein the bonding comprises hybrid bonding.

8. A method for forming a semiconductor device, comprising:
   forming a plurality of first semiconductor structures on a first wafer, wherein a first one of the first semiconductor structures comprises a processor free of a cache memory, a second one of the first semiconductor structures comprises a row decoder, and a third one of the first semiconductor structures is a column decoder;
   forming a first bonding layer comprising a plurality of first bonding contacts above the plurality of first semiconductor structures;
   dicing the first wafer into a plurality of first dies, such that at least one of the first dies comprises the the first semiconductor structures;
   forming a plurality of second semiconductor structures on a second wafer, wherein at least one of the second semiconductor structures comprises an array of static random-access memory (SRAM) cells free of a decoder circuit;
   forming a second bonding layer comprising a plurality of second bonding contacts above the plurality of second semiconductor structures;
   dicing the second wafer into a plurality of second dies, such that at least one of the second dies comprises the second semiconductor structures; and
   bonding the first die and the second die in a face-to-face manner, such that the row decoder and the column decoder of the first semiconductor structures is are electrically coupled to the array of SRAM cells through the first and second bonding, wherein the first bonding contacts are in contact with the second bonding contacts at a bonding interface.

9. The method of claim 8, further comprising:
forming a first interconnect layer above the processor,
wherein the first bonding layer is disposed above the first interconnect layer.

10. The method of claim 9, wherein forming the plurality of first semiconductor structures further comprises forming, on the first wafer, a peripheral circuit of the array of SRAM cells of the second wafer.

11. The method of claim 9, wherein forming the plurality of first semiconductor structures further comprises forming an interface circuit on the first wafer.

12. The method of claim 8, further comprising:
forming a second interconnect layer above the array of SRAM cells,
wherein the second bonding layer is disposed above the second interconnect layer.

13. The method of claim 8, wherein
the plurality of second semiconductor structures are above the plurality of first semiconductor structures after the bonding; and
the method further comprises:
thinning the second wafer to form a semiconductor layer after the bonding; and
forming a pad-out interconnect layer above the semiconductor layer.

14. The method of claim 8, wherein
the plurality of first semiconductor structures are above the plurality of second semiconductor structures after the bonding; and
the method further comprises:
thinning the first wafer to form a semiconductor layer after the bonding; and
forming a pad-out interconnect layer above the semiconductor layer.

15. The method of claim 8, wherein the bonding comprises hybrid bonding.

16. The method of claim 1, wherein the array of SRAM cells is distributed in a plurality of separate regions within the second wafer.

17. The method of claim 16, wherein the separate regions correspond to separate cache memories.

18. The method of claim 8, wherein the array of SRAM cells is distributed in a plurality of separate regions within the second wafer.

19. The method of claim 18, wherein the separate regions correspond to separate cache memories.

20. A method for forming a semiconductor device, comprising:
forming on a first wafer, at least one processor, at least one row decoder, and at least one column decoder, the first wafer being free of a cache memory;
forming a first bonding layer above the at least one processor, the first bonding layer comprising a plurality of first bonding contacts;
forming, on a second wafer, a plurality of static random access memory (SRAM) cells arranged as two or more arrays of SRAM cells, the second wafer being free of row decoders and free of column decoders;
forming a second bonding layer above the two or more arrays of SRAM cells, the second bonding layer comprising a plurality of second bonding contacts;
bonding the first wafer and the second wafer in a face-to-face manner, such that the at least one row decoder is electrically coupled to at least one of the two or more arrays of SRAM cells, wherein the first bonding contacts are in contact with the second bonding contacts at a bonding interface; and
dicing the bonded first and second wafers into a plurality of dies, wherein at least one of the dies, wherein at least one of the dies comprises the bonded first and second semiconductor structures.

* * * * *